United States Patent
Schramek et al.

(10) Patent No.: US 9,097,438 B2
(45) Date of Patent: Aug. 4, 2015

(54) CENTRAL RECEIVER SOLAR SYSTEM COMPRISING A HELIOSTAT FIELD

(75) Inventors: Philipp Schramek, Starnberg (DE); Joachim Maass, Starnberg (DE)

(73) Assignee: Philipp Schramek, Starneberg (DE)

( * ) Notice: Subject to any disclaimer, the term of this patent is extended or adjusted under 35 U.S.C. 154(b) by 346 days.

(21) Appl. No.: 13/817,844

(22) PCT Filed: Jul. 22, 2011

(86) PCT No.: PCT/EP2011/003690
§ 371 (c)(1),
(2), (4) Date: May 3, 2013

(87) PCT Pub. No.: WO2012/022418
PCT Pub. Date: Feb. 23, 2012

(65) Prior Publication Data
US 2013/0220303 A1 Aug. 29, 2013

(30) Foreign Application Priority Data
Aug. 20, 2010 (DE) .......................... 10 2010 034 986

(51) Int. Cl.
*F24J 2/10* (2006.01)
*F24J 2/38* (2014.01)
(Continued)

(52) U.S. Cl.
CPC .... *F24J 2/38* (2013.01); *F24J 2/02* (2013.01); *F24J 2/07* (2013.01); *F24J 2/1047* (2013.01);
(Continued)

(58) Field of Classification Search
CPC .............. F24J 2002/0038; F24J 2/5424; F24J 2002/075; F24J 2002/108
USPC ........................ 359/597, 853; 353/3; 236/684
See application file for complete search history.

(56) References Cited

U.S. PATENT DOCUMENTS

| 4,044,753 A | 8/1977 | Fletcher et al. |
| 4,117,682 A | 10/1978 | Smith |

(Continued)

FOREIGN PATENT DOCUMENTS

| DE | 10 2006 053 758 A1 | 5/2008 |
| EP | 0 909 929 A2 | 4/1999 |

(Continued)

OTHER PUBLICATIONS

Winter, C.-J., et al., Solar Power Plants, Berlin, Heidelberg, New York: Springer, 1991, pp. 237-241.

(Continued)

*Primary Examiner* — Christopher Mahoney
(74) *Attorney, Agent, or Firm* — Hudak, Shunk & Farine Co. LPA

(57) ABSTRACT

The aim of the invention is to build central receiver solar power plants in which the heliostat fields can be used more efficiently. To achieve said aim, a heliostat field consisting of a near field having a uniform reflector surface density ρ of more than 60% is preferably combined with a far field whose reflector surface density ρ decreases as the distance from the receiver increases. The invention also comprises central receiver solar power plants which consist exclusively of a near field having a uniform reflector surface density ρ of more than 60%. The high reflector surface density ρ in the near field and in areas of the far field is achieved by the use of heliostats having rectangular reflectors and a rigid horizontal axle suspension (FHA) or, alternatively, by heliostats having rectangular reflectors and a rigid quasipolar axle suspension (FQA). The heliostat field concentrates the solar radiation on a receiver whose target surface, aperture, thermal absorber or photovoltaic absorber has a normal vector which is directed downward to the heliostat field that extends below the receiver in the directions North, East, South and West. The receiver is mounted in a suspended manner to a support structure that extends over the heliostat field.

17 Claims, 20 Drawing Sheets

(51) Int. Cl.
  *F24J 2/07* (2006.01)
  *F24J 2/16* (2006.01)
  *F24J 2/54* (2006.01)
  *F24J 2/02* (2006.01)
  *G06F 17/50* (2006.01)

(52) U.S. Cl.
  CPC .. *F24J 2/16* (2013.01); *F24J 2/542* (2013.01); *F24J 2/5424* (2013.01); *G06F 17/50* (2013.01); *F24J 2002/075* (2013.01); *F24J 2002/108* (2013.01); *Y02E 10/41* (2013.01); *Y02E 10/47* (2013.01)

(56) References Cited

U.S. PATENT DOCUMENTS

| | | | |
|---|---|---|---|
| 4,172,443 | A | 10/1979 | Sommer |
| 4,220,140 | A | 9/1980 | Francia |
| 2004/0004175 | A1 | 1/2004 | Nakamura |
| 2010/0006087 | A1* | 1/2010 | Gilon et al. .............. 126/572 |
| 2011/0259320 | A1* | 10/2011 | Yuasa et al. .............. 126/601 |
| 2012/0123720 | A1* | 5/2012 | Fukuba et al. .............. 702/94 |
| 2012/0186251 | A1* | 7/2012 | Epstein et al. ........... 60/641.11 |
| 2013/0284162 | A1* | 10/2013 | Burton .................. 126/601 |

FOREIGN PATENT DOCUMENTS

| | | | |
|---|---|---|---|
| EP | 2 000 669 | A2 | 6/2008 |
| FR | 2 292 200 | A1 | 6/1976 |
| WO | 02 070966 | A1 | 9/2002 |
| WO | 2008 092194 | A1 | 8/2008 |
| WO | 2008 092195 | A1 | 8/2008 |
| WO | 2008 153922 | A1 | 12/2008 |
| WO | 2008 154521 | A1 | 12/2008 |
| WO | 2009 021099 | A2 | 2/2009 |
| WO | 2010 050467 | A1 | 5/2010 |

OTHER PUBLICATIONS

Burgalet, J-I; Arias, S; Salbidegoitia I.B., Operative advantage of a central tower solar plant with thermal storage system, in SolarPACES 2009, Conference Proceedings, Sep. 1-18, 2009, Berlin, Germany, ISBN 978-3-00-028755-8.

Gould, B.: Molten Salt Power Towers, Presentation at Doe Program Review, Austin, Texas Apr. 23, 2008.

Koll, G.; Schwarzbözl, P.; Hennecke, K.; Hartz, T.; Schmitz, M.; Hoffschmidt, B.; The solar tower Jülich—A research and demonstration plant for central Receiver Systems, in SolarPACES 2009 Conference Proceedings, ISBN 978-3-00-028755-8.

Abengoa Solar S.A., White Paper on Solar Tower Technologies, Solutions to Global Climate Change, downloaded on Aug. 19, 2010 from www.abengoasolar.com of Abengoa Solar S.A. with headquarters at Avda de la Buhaira 2, 48018 Seville, Spain.

www.esolar.com of eSolar Inc. with headquarters at 130 West Union Street, Pasadena, CA 91103, USA.

Schell, Steve, Design and evaluation of eSolar' s Heliostat field, in SolarPACES 2009 Conference Proceedings, Sep. 1-18, 2009, Berlin, Germany, ISBN 978-3-00-028755-8.

Schramek, P. und Mills, D.R.; Heliostat for maximum ground coverage; Energy 29; 2004; 701-713.

Buck, R., et al., Solar-Hybrid Gas Turbine-based Power Tower Systems (REFOS); Journal of Solar Energy Engineering, vol. 124, Feb. 2002; pp. 2-9.

Liebherr, Data Sheet for Revolving Tower Crane 132 EC-H8 FR.tronic, 132 EC-H8 Litronic. Liebherr-Werk Biberach GmbH, Biberach an der Riss, www.liebherr.com.

\* cited by examiner

CENTRAL RECEIVER SOLAR SYSTEM COMPRISING A HELIOSTAT FIELD

FIELD OF THE INVENTION

The invention concerns a method of designing a heliostat field of a central receiver solar system and a central receiver solar system with a heliostat field, consisting of one or more receivers, a plurality of heliostats forming the heliostat field, which are arranged on a preferably level overall ground surface, wherein the heliostat has a reflector which can be positioned about two rotary axles, which reflects the solar radiation onto the target surface of the one or more receivers as the position of the sun changes, while the target surface is the aperture, the thermal absorber or the photovoltaic absorber of the particular receiver, and the heliostat has a first rotary axle and a second rotary axle, perpendicular to the first one, being arranged on a mounting surface, while the first rotary axle is firmly situated with respect to the mounting surface and the second rotary axle is firmly situated with respect to the reflector, and a supporting structure, on which the one or more receivers are fastened at the top in relation to the ground surface of the heliostat field.

BACKGROUND OF THE INVENTION

In what follows, the basic function of known solar tower power plants or solar tower systems will be explained by means of FIG. 1 to FIG. 6.

FIG. 1 shows a solar tower power plant or solar tower system known from U.S. Pat. No. 4,172,443, having a tower 120, on which a receiver 110 is installed, onto which heliostats 190 concentrate solar radiation. The heliostat field 130 consists of a plurality of such heliostats 190. In other known towers, several receivers can even be installed on the same tower, as shown in EP 2000669 A2. As explained in [1]—especially on pages 27 et seq.—the concentrated radiation through the receiver heats a heat transfer agent, by which a turbine is driven, which then generates electric current via a mechanically coupled generator.

Present-day solar tower systems can be classified and characterized in four solar tower systems, as follows:
1. Solar tower system with surrounding heliostat field (far field), see schematic of a plan view in FIG. 2.
2. Solar tower system with polar field, see schematic of a plan view in FIG. 3.
3. Solar tower system with heliostat field underneath the receiver (near field), see schematic of a plan view in FIG. 4 and in perspective view in FIG. 5.
4. Solar tower system with north and south field, see schematic of a plan view in FIG. 6.

The systems mentioned in FIG. 2 to FIG. 6 shall be described in greater detail below.

1. Solar Tower Systems with Surrounding Heliostat Field (Far Field)

Most (commercial) solar tower systems consist of a cylindrical or inverted frustum-shaped receiver oriented 360° in all directions of the sky, being supported by a central tower and surrounded by a heliostat field 130 formed from individual heliostats 190, as shown in FIG. 1 and as plan view in FIG. 2. A cylindrical receiver or an inverted frustum receiver are receivers with external absorber, in which the envelope surface of the receiver forms the absorber surface. In FIG. 1, a solar tower system known from U.S. Pat. No. 4,172,443 is shown, where a cylindrical receiver 110, whose outer cylindrical envelope forms the absorber surface, is situated on a tower 120 at a receiver height $H_R$ above the heliostat field 130.

FIG. 2 shows the schematic of a plan view of a known solar tower system with a heliostat field 230 surrounding the tower 210 at a distance. The heliostat field 230 has the shape of a ring, where the region 234 around the tower 220 that supports the receiver 210 is free, i.e., no heliostats are arranged in the region 234. The position of the tower with the receiver often does not lie in the exact center, but instead is displaced in the direction of the equator with respect to the heliostat field, i.e., to the south in the northern hemisphere or to the north in the southern hemisphere.

In FIG. 2, the heliostat field consists of a far field. The far field is a heliostat field which—as distinguished from the near field defined further below—surrounds the tower and the receiver with a certain horizontal distance, and whose reflector surface density $\rho$ decreases with increasing distance from the receiver. The reflector surface density $\rho$ is defined as the ratio of the reflector surface of the heliostat field to the ground surface of the heliostat field. FIG. 2 shows the region 234 near the receiver 210 where no heliostats are installed.

Instead of being cylindrical or a continuous frustum, the receiver can also consist of a plurality of individual receivers.

The receiver height $H_R$, as shown in FIG. 1, is defined as the vertical distance of the midpoint of the absorber surface of a receiver with external absorber or the receiver aperture of a receiver with hohlraum receiver from the plane that is defined through the midpoints of the reflectors of the heliostats of the heliostat field. The receiver height $H_R$ is used hereinafter as a unit quantity against which other quantities can be measured, such as the heliostat field size.

The diameter $D_H$ of a heliostat field, as shown in FIGS. 2, 3, 4 and 6, is defined as the distance of the heliostats furthest away from each other.

Solar tower systems with surrounding heliostat field typically have receiver heights $H_R$ of more than 100 m and heliostat fields with a diameter of more than eight receiver heights, i.e., $D_H > 8 \times H_R$. For example, the Gemasolar solar tower described in [2] has a receiver height $H_R$ of 140 m and a diameter $D_H$ of around 1200 m. For example, the solar tower of Solar-Reserve, described in [3], has a receiver height $H_R = 182.88$ m (600 feet) and $D_H = 2600$ m.

2. Solar Tower Systems with Polar Field

As can be seen in the schematic of the plan view of a solar tower system with polar field in FIG. 3, this has a heliostat field 330 only on the polar side—pointing in the northerly direction in the northern hemisphere and in the southerly direction in the southern hemisphere—of the tower 320 and receiver 310 and, as shown EP 2000669 A2, with one or more receivers 310 on the tower 320, oriented to the heliostat field.

Like the far field of a solar tower with surrounding heliostat field, the reflector surface density $\rho$ of the polar field increases with increasing distance from the receiver.

Solar tower systems with polar field typically have receiver heights of 50-150 m and heliostat fields with a diameter $D_H$ of around five to six receiver heights, where $3 \times H_R < D_H < 7 \times H_R$.

For example, the "Solar Tower Jülich" described in [4] has a receiver height $H_R$ of 55 m and a diameter $D_H$ of the heliostat field of around 300 m.

For example, the "PS10 Solar Tower" described in [5] has a receiver height $H_R = 115$ m and a diameter $D_H = 750$ m, the "PS20 Solar Tower" has $H_R = 165$ m and $D_H = 1000$ m.

3. Solar Tower System with Heliostat Field Underneath the Receiver (Near Field)

In the 1960s, a first solar tower system was developed by Giovanni Francia in Italy where the heliostat field is located underneath the downwardly directed receiver and extends in the north, south, east and west direction. This is depicted in FIG. 4, where the heliostat field 430 and the position of the receiver 410 are seen in plan view. Unlike the above-discussed far field, the heliostat field is a near field in which the heliostats are mounted with constant reflector surface density ρ. The receiver 510 is mounted suspended from a jib system 520, as shown in FIG. 5. For further explanations, see page 238 in [1] and U.S. Pat. No. 4,220,140. From FIG. 7.77 on page 238 in [1] one can see that the heliostat field of round heliostats has a quite large reflector surface density ρ of around 60%, which cannot be achieved with rectangular heliostats—on this, see page 706 in [8]. No further detailed published data on the reflector surface density ρ of the solar tower system of Giovanni Francia is known.

The solar tower systems developed by Giovanni Francia with heliostat field underneath the receiver typically have receiver heights $H_R$ of less than 20 m and heliostat fields with a diameter $D_H$ of less than two receiver heights $H_R$, i.e., $D_H < 2 \times H_R$, as can be seen from FIG. 7.77 on page 238 in [1]. No further detailed published data is known.

4. Solar Tower System with North and South Field

A further solar tower system described in [7] which has been developed by the firm eSolar Inc., homepage and main office see [6], is a mixture of a solar tower system with surrounding heliostat field and a solar tower system with polar field. As can be seen from the plan view in FIG. 6, it consists of a tower 620, on which is situated a receiver 610 with two apertures, and a north field 631 and a south field 632, which together nearly surround the tower 620, like a surrounding heliostat field. In this case, the single receiver 610 has two apertures, one directed toward the north field and the other toward the south field, as described more closely in [7].

Characteristic of this heliostat field of the solar tower system from eSolar Inc. is the uniform reflector surface density ρ of the entire heliostat field. See WO 2008/154521 A1. However, the heliostat field of eSolar Inc. differs from the solar tower system with near field of Giovanni Francia in that the heliostat field is not located underneath the receiver and the reflector surface density ρ is less than 50%.

Solar tower systems with north and south field from eSolar Inc. typically have receiver heights $H_R$ of around 50 m and heliostat fields with a diameter $D_H$ of around five receiver heights, that is: $D_H = 5 \times H_R$, as described further in [7].

Other known technologies for solar tower system are the most used heliostats with rigid vertical axle suspension (FVA) and the known but usually not used heliostats with rigid horizontal axle suspension (FHA), which will be explained by means of FIG. 7 to FIG. 10.

Heliostats with Rigid Horizontal Axle Suspension (FHA)

In WO 02/070966 A1, WO 2008/092194 A1, WO 2008/092195 A1 and [8], heliostats with rigid horizontal axle suspension (FHA) are described. Heliostats with FHA differ from conventional heliostats, which have a rigid vertical axle suspension (FVA), by the spatial volume in which the reflectors can move freely on account of their suspension.

A heliostat has a first rotary axle and a second rotary axle, arranged perpendicular to the first, and it is arranged on a mounting surface, where the first rotary axle is fixed relative to the mounting surface and the second rotary axle is fixed relative to the reflector.

In FIG. 7 are shown representations of the principle of a heliostat with FVA, known from [8]. In FIG. 7a is shown the principle of a heliostat with FVA and in FIG. 7b a sample rectangular heliostat, and in FIG. 7c the corresponding spatial volume in which the reflector of the heliostat can move freely on account of the suspension. As can be seen in FIG. 7a and FIG. 7b, in a heliostat with FVA the first rotary axle 792 rigidly connected to the mounting surface or ground surface is vertical or perpendicular to the mounting surface or ground surface, while the second rotary axle 793, perpendicular to the first, can move about the first rotary axle 792.

In FIG. 7c is shown the spatial volume 799 in which the reflector can move freely on account of the suspensions. The spatial volume is a semicircular body, corresponding to a layer of a sphere in which the surfaces are located at top and bottom, i.e., perpendicular to the first vertical rotary axle 792 rigidly joined to the mounting surface. In FIG. 13 in WO 2008/092195 A1 and the corresponding discussion, a heliostat with FVA and corresponding spatial volume in which the reflector of the heliostat can move freely on account of the suspension is depicted and explained.

FIG. 8 from [8] shows at what distances one can set up heliostats 890 with FVA without overlapping of the spatial volumes 899 in which the reflectors of the heliostat 890 can move freely, so as to avoid collision between the heliostats.

The known manufacturers of heliostats use heliostats with FVA.

In a heliostat with FHA, the first rotary axle 992 rigidly joined to the mounting surface is parallel to the mounting surface or ground surface, as can be seen in the system representation of FIG. 9a. The first rigid horizontal rotary axle 992 in the heliostat with FHA is rigidly joined to the ground, as shown in WO 2008/092194 A1 and WO 2008/092195 A1, while the second rotary axle 993, perpendicular to the first, can turn about the first rotary axle 992.

As can be seen in FIG. 9b, the spatial volume 999 in which the reflector of a heliostat with FHA can move freely is equal to that of the heliostat with FVA, but rotated by 90°, so that the rotary axle 992 rigidly joined parallel to the mounting surface is perpendicular to the surfaces of the semicircular body. In FIG. 12 of WO 2008/092195 A1 and the accompanying discussion, a heliostat with FHA and the corresponding spatial volume in which the reflector of the heliostat can move freely on account of the suspension are explained.

As can be seen in FIG. 10 and as known from [8], heliostats with FHA can be set up close together in rows without overlapping of the spatial volumes 1099 in which the reflectors of adjacent heliostats 1090 can move freely. In FIG. 10 the theoretically maximum reflector surface density for the given reflector size is shown, with no safety margin between adjacent heliostats. Furthermore, the rows are staggered so as to place them as close together as possible.

It should be recognized that heliostats with FHA enable higher reflector surface densities than heliostats with FVA. As shown in FIG. 10 in [8] and deduced from the accompanying discussions, the maximum possible reflector surface density of rectangular heliostats with FVA in the ideal case is around 58%, while rectangular heliostats with FHA enable substantially higher reflector surface densities, with theoretically up to almost 100%. As is known from [8], the theoretically possible maximum reflector surface density ρ of a heliostat field increases when each reflector 995 is longer in the direction of the second rotary axle 993 than in the direction perpendicular to this.

In FIG. 6 in WO 02/070966 A1 and the accompanying discussion, the mechanical coupling of heliostats with FHA is shown.

Furthermore, different receiver technologies are known, especially the Hohlraum receiver shown in FIG. 11.

Receivers

There are receivers, as shown in FIG. 1, where the envelope surface constitutes the absorber surface, as already discussed. Other receivers have a target surface, i.e., an aperture or absorber surface, whose surface normals are oriented essentially in the same direction.

In FIG. 11 one sees the cross section of a Hohlraum receiver known from [9]. Concentrated solar radiation enters the Hohlraum receiver through the aperture 1111 and impinges on the absorber 1115, where the heat is surrendered to a heat transfer agent. In the system shown, the heat transfer agent is air, which enters the receiver through the inlet 1117 and, being heated, leaves through the outlet 1118. This kind of receiver, furthermore, has a glass dome 1113 to keep the air in the receiver. This principle of a Hohlraum receiver is also known from the patent document U.S. Pat. No. 4,220,140 and WO 2008/153922 A1.

SUMMARY OF THE INVENTION

The problem of the invention is to construct a central receiver solar system in which the heliostat field can be utilized more efficiently.

This problem is solved by a method for design of a heliostat field of a central receiver solar system with a heliostat field, consisting of a) one or more receivers, b) a plurality of heliostats, forming the heliostat field, which are arranged on a preferably level overall ground surface, wherein each heliostat has a reflector that can be moved about two rotary axles, which reflects the solar radiation onto the target surface of the one or more receivers during changing position of the sun, wherein the target surface is configured as an aperture or a thermal absorber or a photovoltaic absorber of the respective receiver and a central receiver solar system with a heliostat field wherein the near field the spacings of neighboring heliostats within each row have a predetermined first spacing and the spacings of neighboring rows have a predetermined second spacing from each other in the direction perpendicular to this.

Accordingly, the one or more receivers can be held above a heliostat field so that heliostats can also be installed directly underneath the receiver. For a downwardly directed receiver, heliostats in the region underneath the receiver have especially large efficiencies. Thanks to the installation of heliostats with rectangular reflectors in which the first rotary axle is parallel to the mounting surface, or heliostats with rigid horizontal axle suspension (FHA), the heliostats with common mounting surface can be installed in rows (preferably in the east-west direction) with very high mounting density.

Thanks to the use of rectangular reflectors, where the reflector is preferably longer in the direction of the second rotary axle than in the direction perpendicular to this, the distances between the heliostat rows (preferably in the north-south direction) can be reduced more as the ratio of the side lengths is greater, as shown in FIG. 10 in [8] and deduced from the accompanying explanations. In this way, it is possible to install many heliostats in the region underneath the receiver, where these have an especially high efficiency, with a reflector surface density $\rho$ of $\rho > 60\%$ and make optimal use of this region. Thus, the heliostat field extends continuously in the north, east, south and west direction. With increasing distance from this region, the efficiency falls off. With increasing number of heliostats, the radiation power at the receiver increases, but the power increase per heliostat decreases with each additional, less efficient heliostat. By the efficient utilization of the region underneath the receiver, located in the near field of the heliostat field, fewer heliostats on the whole are needed than in solar tower power plants with surrounding heliostat field to achieve the same radiation power at the receiver.

The installation of the heliostats in rows enables the high mounting density in the near field. Heliostats in east-west rows are the preferred design, while the orienting of the rows in north-south direction is likewise advisable and leads to nearly the same efficiency as heliostat rows in the east-west direction.

For applications where the mounting surface of the heliostats is tilted to the overall ground surface by an angle $\alpha$, an orientation of the heliostat rows in the north-south direction is an advisable solution for heliostats with rigid quasipolar axle suspension (FQA), by which high reflector surface densities can also be accomplished in the near field. Furthermore, similar mounting systems can be used for the support structures of such heliostats as have been developed for the rigid mounting of photovoltaic modules in solar parks. Moreover, the possibility of the mechanical coupling of the heliostats offers potential cost savings.

There are various support structures to hold the receiver above the heliostat field. An arch system is mentioned, a truss (triangular support structure), both of which have a supporting statics, while the system has a suspended cable structure in which the footpoints are installed outside the heliostat field, just as with the arch and truss, so that the receiver is suspended from a cable system above the heliostat field. The support structure is based on the concept of a revolving tower crane, where a jib or cantilever arm holds the receiver above the heliostat field. This system is primarily suited to small central receiver solar systems in which the receiver height $H_R$ is less than around 70 m. Since the length of the jib of a conventional revolving tower crane is sufficient in the case of small systems to have the footpoint beyond the heliostat field on the side of the receiver away from the equator, this can reduce the overshadowing of the heliostat field by the support structure of the receiver. Furthermore, the use of a revolving tower crane allows the receiver to move in three dimensions, like a load is moved by a revolving tower crane, and thus increase the efficiency of the heliostat field by an optimal positioning of the receiver.

The receiver is mounted on the particular support structures so that it is mounted on the local bottom side of the support structure, and thus the support structure does not block the radiation reflected by the heliostat field.

In the near region a large invariable reflector surface density is possible, but with increasing distance from the receiver the heliostats need to be installed with increasing spacing to prevent the heliostats from blocking each other, i.e., one heliostat cannot reflect a portion of the solar radiation onto the receiver because another heliostat is hampering the beam path to the receiver and thus blocking it. Although the near field already transfers a large part of the radiation power to the receiver, still a far field is needed to accomplish higher radiation powers of over 100 $MW_{th}$ on the receiver at a receiver height $H_R$ of over 100 m. But this far field can be much smaller, thanks to the power of the near field, than with other solar tower systems having radiation powers of over 100 $MW_{th}$ on receivers at a receiver height $H_R$ of over 100 m, which have far fields as surrounding heliostat fields without near fields. As a result, these systems have heliostat fields with substantially larger diameters $D_H$ of more than six receiver heights $H_R$. The special attribute of the system according to the invention is the ability to develop large central receiver solar systems with receiver heights of over 100 m whose diameters $D_H$ are less than six receiver heights. That means that this invention results not only in more efficient utilization of the heliostats but also to more efficient utilization of the ground surface.

The central receiver solar system according to the invention differs from currently known solar tower systems 1 through 4 in the following way.

1. Solar Tower System with Surrounding Heliostat Field a. The system according to the invention has a near field that extends beneath the receiver, in which heliostats with the highest efficiency are installed with reflector surface density $\rho$ greater than 60% with heliostats having rectangular reflector surfaces and heliostats having rigid horizontal axle suspension (FHA) or rigid quasipolar axle suspension (FQA).

b. The heliostat field is continuous and uninterrupted, like the surrounding heliostat field, which has a recess in the region about the tower where the system according to the invention has heliostats with the highest efficiency.

c. The system according to the invention has a receiver with downward directed aperture or absorber surface, which is advantageous not only because heliostats with the highest efficiency can be installed in the near field, but also because the convection and radiation losses are minimized with a receiver directed downward to the heliostat field.

d. The receiver is suspended from a support structure, which reaches across the heliostat field, making it possible to point the receiver at a near field beneath the receiver, which results in higher efficiencies of the heliostats in the near field.

e. The system according to the invention has substantially smaller heliostat fields in the sense of smaller reflector surface and smaller ground surface for the same radiation power on the target surface of the receiver at the designed time.

2. Solar Tower System with North Field.

a. The system according to the invention has a near field that extends beneath the receiver, with reflector surface density $\rho$ greater than 60% with heliostats that have rectangular reflector surfaces and heliostats with rigid horizontal axle suspension (FHA) or rigid quasipolar axle suspension (FQA).

b. The heliostat field extends in all directions of the sky out from the receiver.

c. The system according to the invention has a receiver with downward directed aperture or absorber surface.

d. The receiver is suspended from a support structure, which reaches across the heliostat field.

3. Solar Tower System with Heliostat Field Underneath the Receiver a. The system according to the invention has in addition to the near field also a far field with decreasing reflector surface density $\rho$, so that large central receiver solar systems with receiver heights $H_R$ of over 100 m and radiation powers of over 100 $MW_{th}$ are possible. Current solar tower systems with heliostat field underneath the receiver have receiver heights $H_R$ of less than 30 m and no far field.

b. The central receiver solar system according to the invention has, for low receiver heights $H_R$ of less than 70 m, a revolving tower crane system as the support structure for the receiver, which has its footpoint outside the heliostat field at the side of the receiver away from the equator, and whose receiver position can be changed with the position of the sun in up to three dimensions.

c. The system according to the invention has a near field with reflector surface density $\rho$ greater than 60% with heliostats having rectangular reflector surfaces and heliostats with rigid horizontal axle suspension (FHA) or rigid quasipolar axle suspension (FQA). In FIG. 17 the plan view of a near field is shown with heliostats having FHA and 68% reflector surface density and in FIG. 22 a heliostat field with heliostats having FQA and a near field with a reflector surface density of around 71%.

4. Solar Tower System with North and South Field, a. The system according to the invention has a near field with reflector surface density $\rho$ greater than 60% with heliostats having rectangular reflector surfaces and heliostats with rigid horizontal axle suspension (FHA) or rigid quasipolar axle suspension (FQA).

b. The system according to the invention has a far field with decreasing reflector surface density $\rho$.

c. The system according to the invention has a receiver with downward directed aperture or absorber as the target surface.

d. The receiver is suspended from a support structure that reaches across the heliostat field.

None of the four above-mentioned solar tower systems has a near field with reflector surface density $\rho$ greater than 60% with heliostats having rectangular reflector surfaces and heliostats with rigid horizontal axle suspension (FHA) or rigid quasipolar axle suspension (FQA).

BRIEF DESCRIPTION OF THE DRAWINGS

In the drawings in the figures, the same reference numbers are used for the same situation, and when the last two digits of the reference numbers are identical similar situations are being depicted. The digits coming before the last two digits indicate the number of the particular figure.

In the drawings are shown.

DETAILED DESCRIPTION OF THE INVENTION

Figure 14:
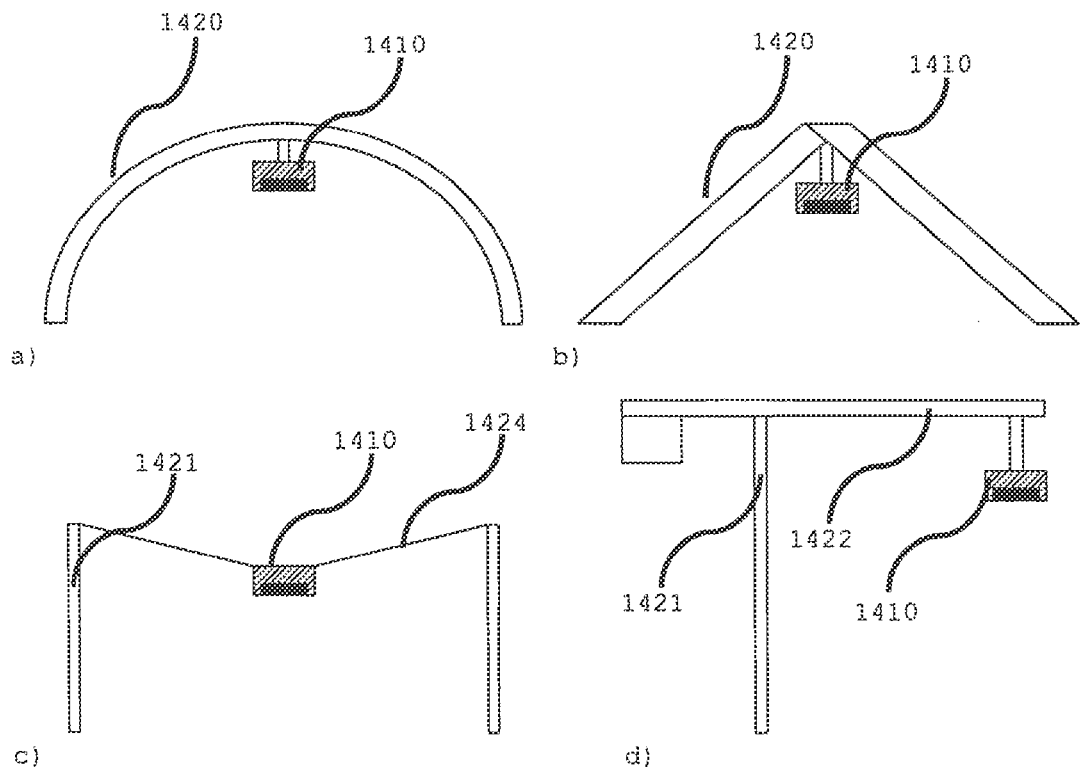

The goal of the invention is to build central receiver solar power plants in which the heliostat fields can be utilized more efficiently. For this, a heliostat field is combined, consisting of a near field with uniform reflector surface density ρ or more than 60% and preferably with a far field whose reflector surface density ρ decreases with increasing distance from the receiver. The invention also involves central receiver solar systems that [consist?] solely of a near field with uniform reflector surface density ρ of more than 60%. The high reflector surface density ρ in the near field and regions of the far field is achieved by the use of heliostats with rectangular reflectors and rigid horizontal axle suspension (FHA) or alternatively heliostats with rectangular reflectors and rigid quasipolar axle suspension (FQA). Heliostats with rigid horizontal axle suspension are described in WO 02/070966 A1, WO 2008/092194 A1, WO 2008/092195 A1 and [8]. Heliostats with rigid quasipolar axle suspension (FQA) are described for the first time in this invention. The heliostat field concentrates the solar radiation on a receiver, whose target surface, the aperture, the thermal absorber or the photovoltaic absorber, has a normal vector that is directed downward at the heliostat field, which extends underneath the receiver in the north, east, south and west directions. The receiver is suspended from a support structure which extends across the heliostat field. This support structure can be, for example, an arch (see FIG. 14a), a truss (see FIG. 14b) or a suspended cable construction (see FIG. 14c) with several footpoints or a crane system with jib or cantilever arm and one footpoint (see FIG. 14d). Ideally, the footpoints lie outside the heliostat field, but can also be inside the field, for example, for static strength reasons.

The invention makes possible central receiver solar systems with receiver heights $H_R$ of over 100 m with radiation powers on the target surface of the receiver of over 100 $MW_{th}$ at the designed time (typically on the date of the summer solstice at 12 noon) and a size of the heliostat field whose diameter $D_H$ is smaller than six receiver heights $H_R$. That means that this invention not only results in more efficient utilization of the heliostats, but also more efficient utilization of the ground surface.

Heliostats with Rigid Quasipolar Axle Suspension (FQA)

An alternative heliostat according to the invention for heliostat fields with high reflector surface density is the heliostat with rigid quasipolar axle suspension (FQA). The heliostat with FQA is a further development of the heliostat with FHA.

Figure 12:
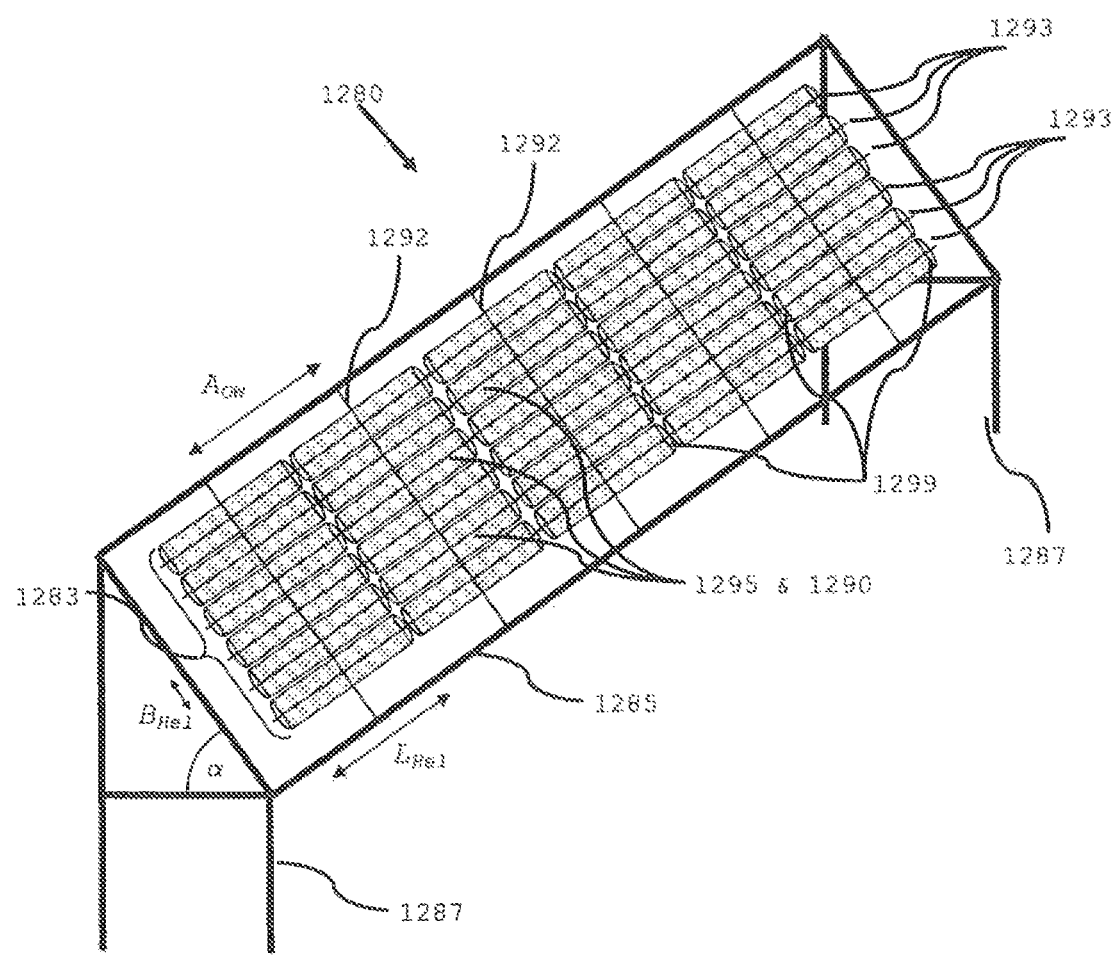

In FIG. 12 is shown a module 1280 of heliostats with rigid quasipolar axle suspension (FQA), in which the first rotary axle 1292 is rigidly joined to the frame 1285 of the module so that this first rotary axle 1292 is tilted relative to the overall ground surface on which the feet 1287 of the module 1280 lie by an angle α, indicated in FIG. 12. The second rotary axles 1293 lie perpendicular to the first and move with the reflectors 1295, to which they are rigidly joined, about the first rotary axle 1292. A heliostat with FQA is thus a further development of a heliostat with FHA in which the mounting surface, to which the first rotary axle 1292 is rigidly joined and parallel, is tilted by an angle α relative to the overall ground surface. The tilted mounting surface is equal to the surface spanned by the frame 1285 of the module system in FIG. 12.

In the preferred embodiment shown in FIG. 12, the mounting surface spanned by the module frames 1285 is tilted about the east-west axis relative to the overall ground surface and the first rotary axle 1292 is oriented in the north-south direction. By movement about the first rotary axle 1292, the heliostats primarily track the daily course of the sun in the east-west direction, while the heliostats by moving about the second rotary axle 1293 track primarily the height of the sun.

In the embodiment of FIG. 12, each time six heliostats with FQA and a common mounting surface form a group of heliostats 1283. Five such groups of heliostats form a module with a common support system.

Figure 13:
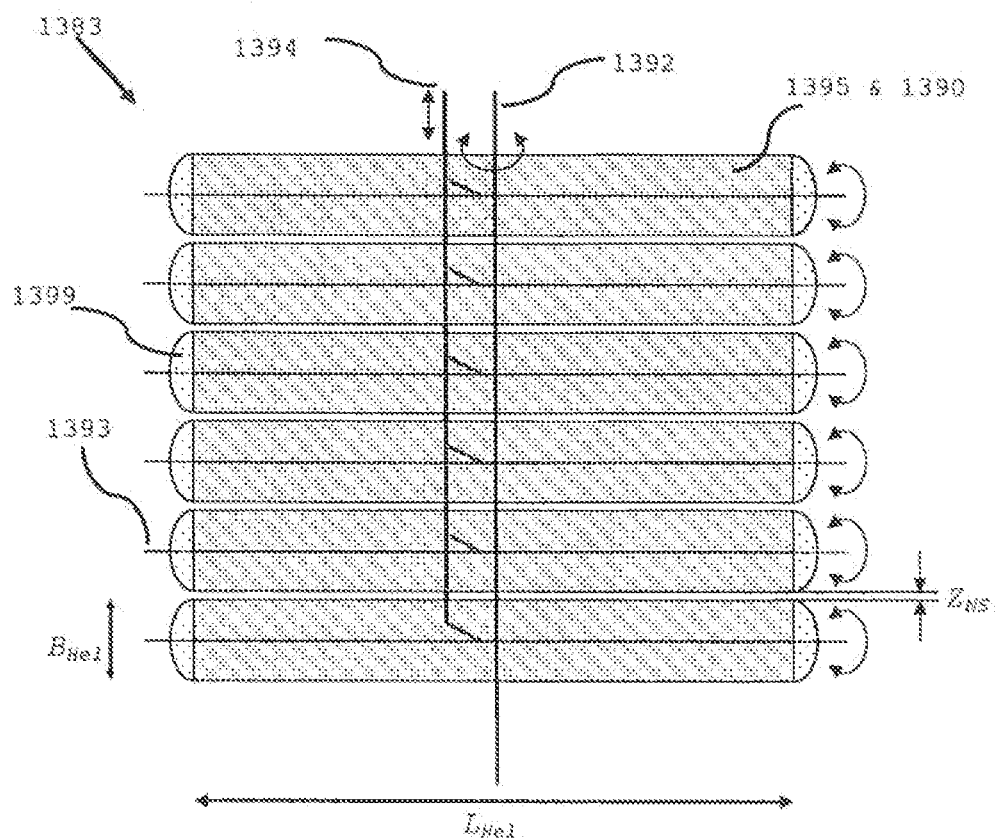

FIG. 13 shows the plan view of a group of heliostats 1383 made up of six heliostats 1390 with FQA. The spatial volume 1399 of the heliostats 1390 enables a close positioning of the heliostats within the depicted group of heliostats. The tracking of the reflectors of the heliostats can be coupled via the first rotary axle 1392. Likewise, the movements about the second rotary axles 1393, which are parallel, can be coupled via a common mechanism 1394.

In the preferred embodiment shown in FIG. 12 and FIG. 13, groups of heliostats 1283 and 1383 are installed in rows with a common mounting surface, so that they have a common first rotary axle 1292 and 1392 and the movement about this first rotary axle 1292 and 1392 is mechanically coupled. The spatial volumes 1299 and 1399 of the reflectors 1295 and 1395 as defined by the orientation of the rotary axles enable the large mounting density in rows, as in the case of the heliostats with FHA.

The orientation of the common mounting surface by the angle α and thus the first rotary axle parallel to it is oriented to the earth's axis about which the earth moves. In a preferred embodiment, the first rotary axle of a heliostat with FQA having a position on the side of the receiver facing away from the equator would be essentially parallel to the earth's axis, i.e., the angle α would have basically the same magnitude as the geographical latitude of the location. In other positions, north or south of this, the angle α becomes larger or smaller. With increasing distance from the receiver to the nearest earth's pole, the first rotary axle would be increasingly tilted in the vertical, that is, the angle α would become larger, while in the case of heliostats with positions closer to the equator it would be increasingly tilted in the horizontal, that is, the angle α would become smaller. On the side of the receiver facing the equator there may be regions in which the mounting surface and the first rotary axle can be tilted in the other direction.

The angle α of the common mounting surface of a group of heliostats and their first rotary axle is chosen such that the neighboring heliostats within the group of heliostats have a large mounting density, without overshadowing and blocking each other. For this, the angle α is chosen such that the heliostats lie essentially in the same plane when operating on the equinox in March and September at 12 noon solar time. Modules with groups of heliostats with FQA are installed with such spacings in the north-south direction that the mutual shadowing and blocking of the heliostats is slight. Blocking means that one heliostat cannot reflect a portion of the solar radiation onto the receiver because another heliostat is disturbing and thus blocking the beam path to the receiver, while shadowing means that one heliostat is overshadowing another heliostat.

The movement of the heliostats about the second rotary axle 1293 and 1393 can likewise be mechanically coupled, but need not be. In FIG. 13, the essentially linear movement of the mechanism 1394 enables a joint movement of the heliostats 1390 about their second rotary axle 1393.

Figure 6:
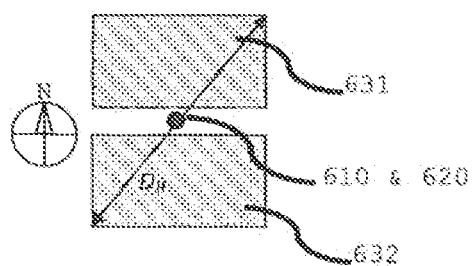
Figure 7:
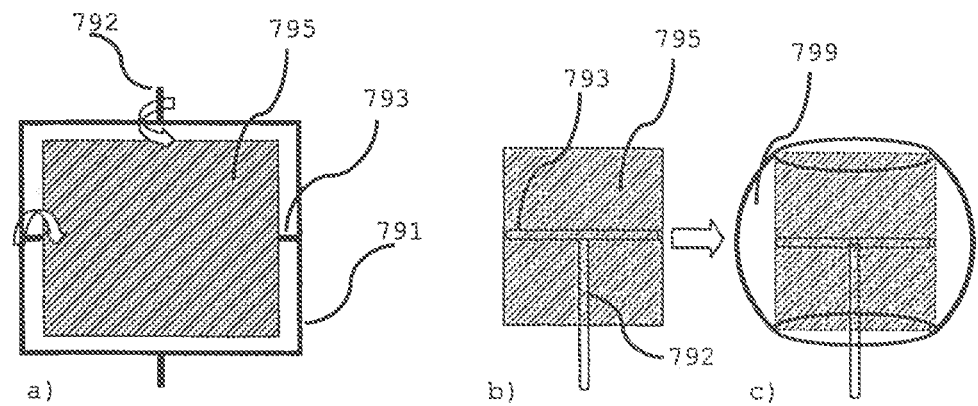
Figure 8:
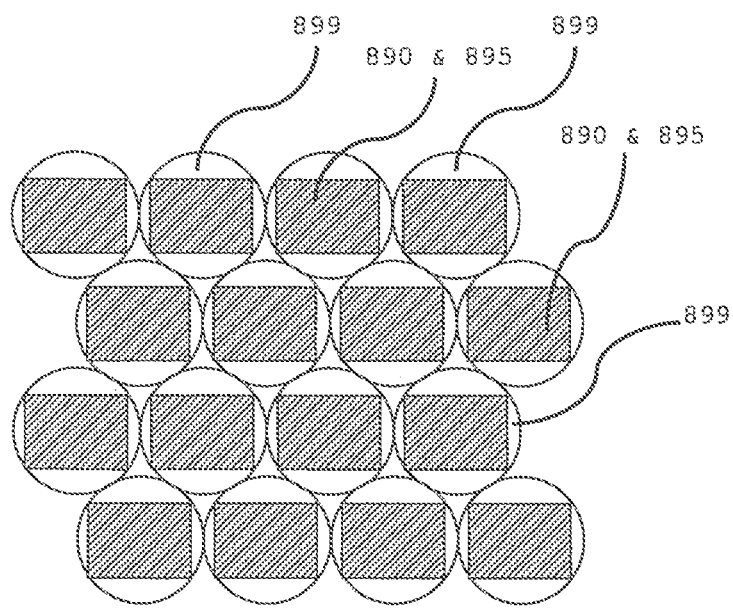

The mechanical coupling of heliostats with FHA in similar manner is shown in similar form in FIG. 6 of WO 02/070966 A1 and the accompanying explanations.

In the preferred embodiment shown in FIG. 12, the reflectors 1295 have an oblong shape, so that the length $L_{Hel}$ is at least twice as large as the width $B_{Hel}$. In the layout of FIG. 12 the reflector 1295 is even at least six times longer than it is wide ($L_{Hel} > 6 \times B_{Hel}$).

The reflectors of the heliostats can be flat or concentrating curved along the length.

Figure 10:
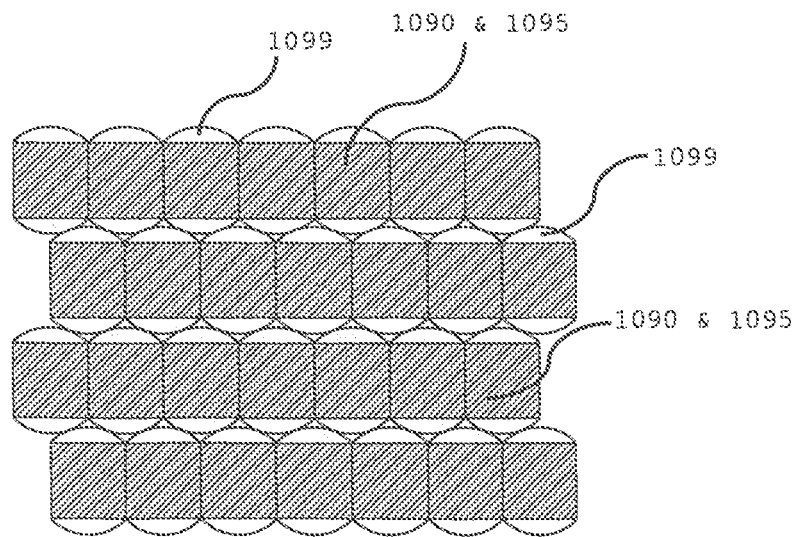
Figure 11:
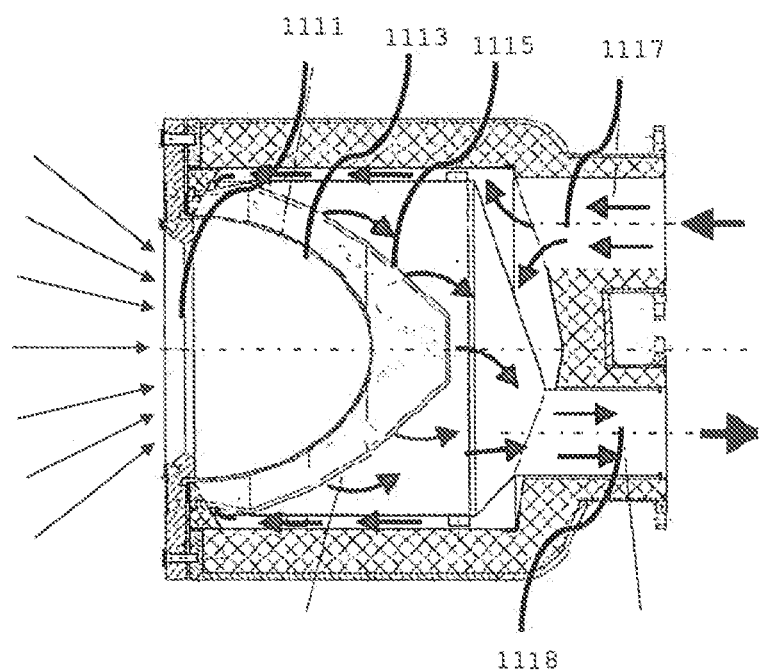

As can be seen in FIG. 12, the spatial volumes resulting from the oblong shape of the reflectors enable a high mounting density of neighboring heliostat rows within a common module 1280. The high mounting density of oblong rectangular reflectors of heliostats with FHA is shown in FIG. 10 of [8]. The same relations hold for heliostats with FQA.

SAMPLE EMBODIMENTS

Sample Embodiment 1

A sample layout of a central receiver solar system based on this patent was designed with the following properties:

Assumptions for Design of the Central Receiver Solar System

Designed time: 21 June, 12 noon, solar time.
Location: latitude 34° N, north latitude, (e.g., North Africa or Southern California, USA).
Assumption: direct normal radiation (solar radiation power) at the designed time: 1000 W/m².
Radiation power (thermal power in Megawatt—$MW_{th}$) on the target surface of the receiver at the design time: 140 $MW_{th}$.

Receiver

Figure 15:
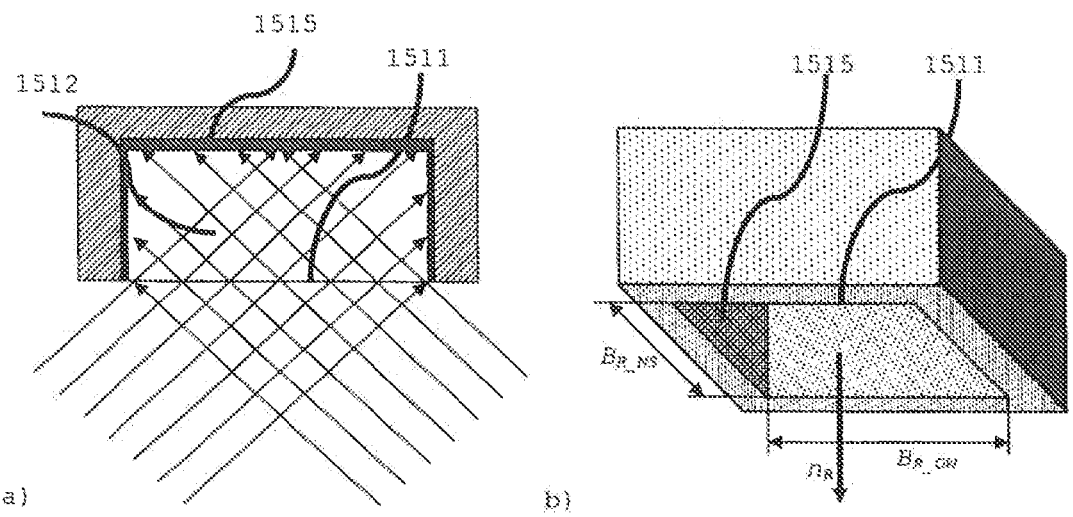

The receiver used is a hohlraum receiver, as depicted in FIG. 15, where the absorber 1515 is situated in a cavity 1512. The solar radiation enters through the optical opening, or aperture 1511, into the cavity 1512 and impinges there on the absorber 1515, which changes the solar radiation into heat. The absorber 1515 can also have different shapes and structures. The normal vector $n_R$ of the aperture surface points downward. $B_{R\_NS}$ is the width of the rectangular aperture 1511 in the north-south direction and $B_{R\_EW}$ that in the east-west direction. For the dimensions of the aperture 1511 of the hohlraum receiver, as shown in FIG. 15:

$$B_{R\_NS}=12.5m, B_{R\_EW}=12.5m (156.25m^2)$$

For the height of the receiver above the heliostat field, the receiver height, we have $H_R=150$ m.

Receiver Support Structure

The receiver is suspended from a support structure, which holds the receiver freely over the heliostat field. This can be, for example, an arch system with two footpoints, as shown in FIG. 14a. The arch would stretch from east to west across the heliostat field.

Heliostats

Heliostats with rigid horizontal axle suspension (FHA).

$$\text{Reflector surface } F_{Hel}=B_{Hel}\times B_{Hel}=7.2225m^2.$$

$$L_{Hel}=3.21m \text{(length)}, B_{Hel}=2.25m \text{(width)}.$$

The reflectors of the heliostats are flat and not concentrating curved.

Heliostat Field

The heliostats are set up in parallel rows in the east-west direction, while the heliostats also stand in rows in the north-south direction. See FIG. 17 and FIG. 18. In other layouts, the heliostats of neighboring east-west rows are also staggered from each other by half the heliostat spacing $A_{EW}$ (see FIG. 17), as in FIG. 10.

The heliostat field consists of a near field 1636 and a far field 1638.

Figure 16:
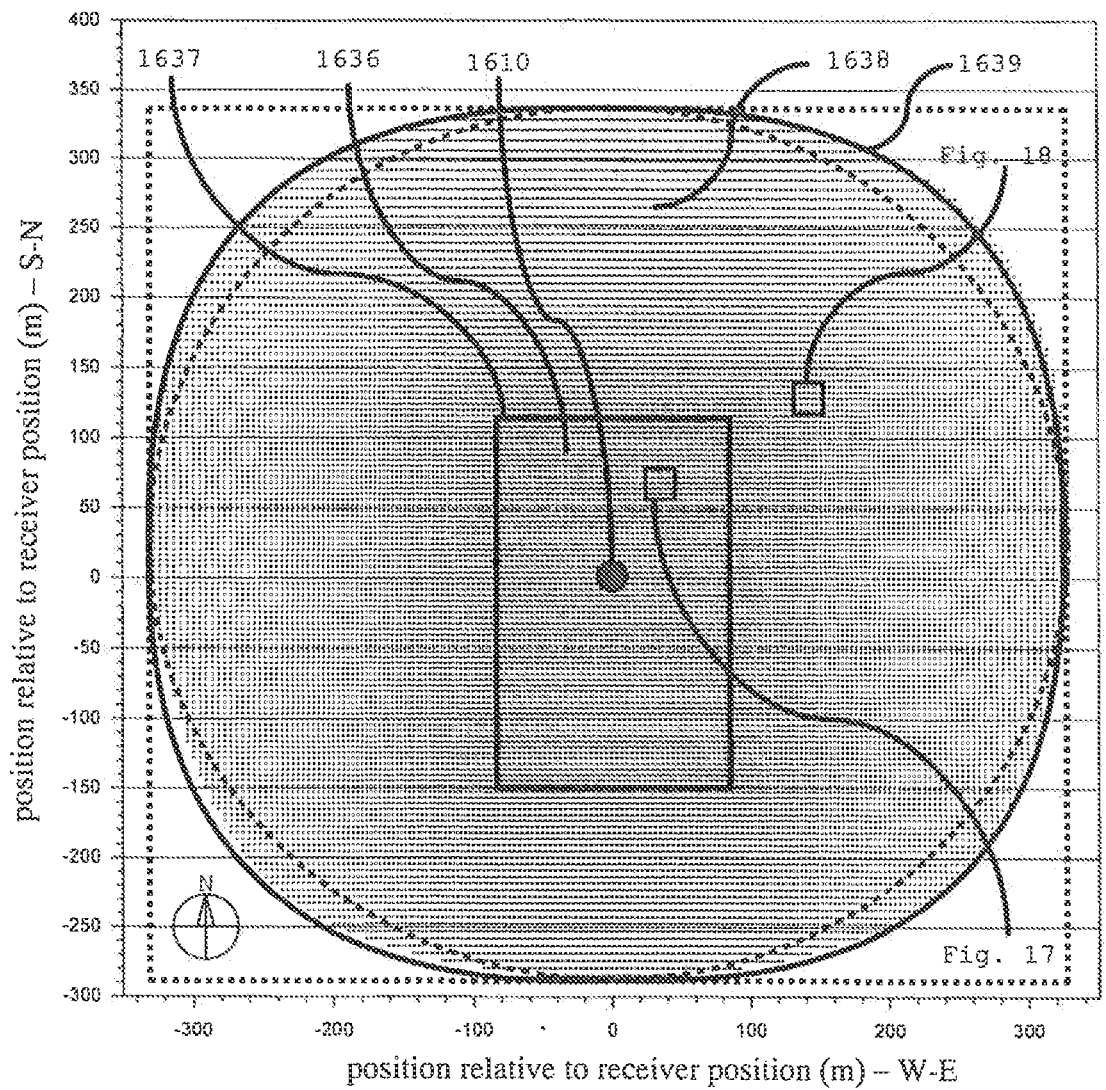

In FIG. 16 is depicted the described heliostat field, consisting of a near field 1636 and the far field 1638, shown in a plan view, where each individual point represents the position of a single heliostat in the north-south direction and east-west direction. The zero point of the system of coordinates is defined by the position of the center of the receiver 1610, represented here by a larger point, not drawn to scale. The outer margin of the near field 1637 is at the same time the border with the far field. The outer margin of the far field is at the same time the outer margin of the entire heliostat field 1639.

Figure 17:
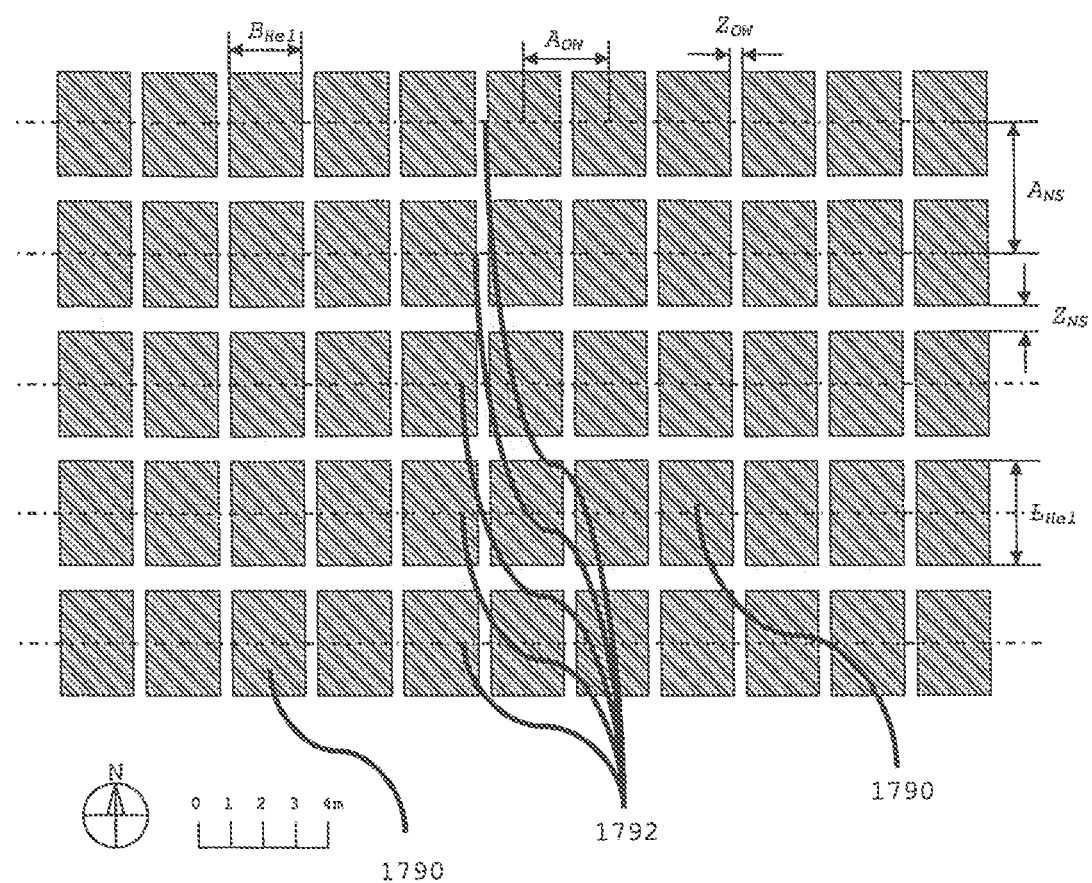

In the near field 1636 the heliostats are set up at constant spacing from each other with the maximum reflector surface density, as is evident from the magnified cutout of the plan view of the near field in FIG. 17. The reflector surface density $\rho$ in the near field is equal to the maximum reflector surface density $\rho_{max}$ in the heliostat field.

The near region of the heliostat field extends, according to FIG. 16, in the east-west direction from 85 m east of the receiver to 85 m west of the receiver and in the north-south direction from 115 m north of the receiver to 150 m south of the receiver.

In FIG. 17 is shown a cutout from the plan view of a near field, drawn to scale, with the spacings of the heliostats 1790 in the east-west and in the north-south direction.

In the east-west direction, the heliostats in the near field are set up with spacings $A_{EW}$ of 2.5 m, i.e., each time there is an interval $Z_{EW}$ of 0.4 m between the reflectors with width $B_{Hel}$ of 2.25 m when these are located in the horizontal park position, where the reflectors are horizontal and the long sides of the heliostats are oriented in the north-south direction, as shown in the plan view of FIG. 17.

The large mounting density within the east-west rows of around 85% (=2.25 m/2.65 m) is possible thanks to the use of heliostats with rigid horizontal axle suspension (FHA), as described in WO 02/070966 A1, WO 2008/092194 A1 and WO 2008/092195 A1. The rigid horizontal axle suspension of the heliostats even allows a fundamentally larger mounting density within the east-west rows when the installation and fabrication are precise and local safety standards are fulfilled. In FIG. 10 it is shown how heliostats 1090 with FHA can be set up with maximum mounting density in the east-west direction without tolerances between the heliostats.

In the north-south direction the heliostat rows are set up in the near field with spacings $A_{NS}$ of 4.01 m, i.e., each time there is an interval $Z_{NS}$ of 0.8 m between the reflectors with length $L_{Hel}=3.21$ m (and thus rows 3.21 m wide) when they are in the horizontal park position. See FIG. 17. The mounting density of the rows can also be fundamentally higher if the heliostat rows are staggered each time by half the heliostat spacing $A_{EW}$ (see FIG. 17), as shown in FIG. 10.

From the combination of the mounting density in the east-west and in the north-south, one gets a constant reflector surface density in the near field of $\rho_{max}=$around 68%

The constant reflector surface density $\rho$ in the near field corresponds to the maximum reflector surface density $\rho_{max}$ which is calculated by the following formula in the near field: $\rho_{max}=\rho=(B_{Hel}\times L_{Hel})/(A_{EW}\times A_{NS})$.

With rectangular heliostats having rigid vertical axle suspension (as do all known commercial heliostats) in the ideal case (square mirrors) a theoretically maximum reflector surface density of around 58% can be achieved, as is explained and derived in [8].

In the far field, the spacings increase with increasing distance from the receiver 1610 both in the east-west and north-south orientation. In the far field the spacings $A_{EW}$ in the east-west direction grow from 2.65 m to 5 m and the spacings $A_{NS}$ in the north-south direction from 4.01 m to 8 m.

Figure 18:
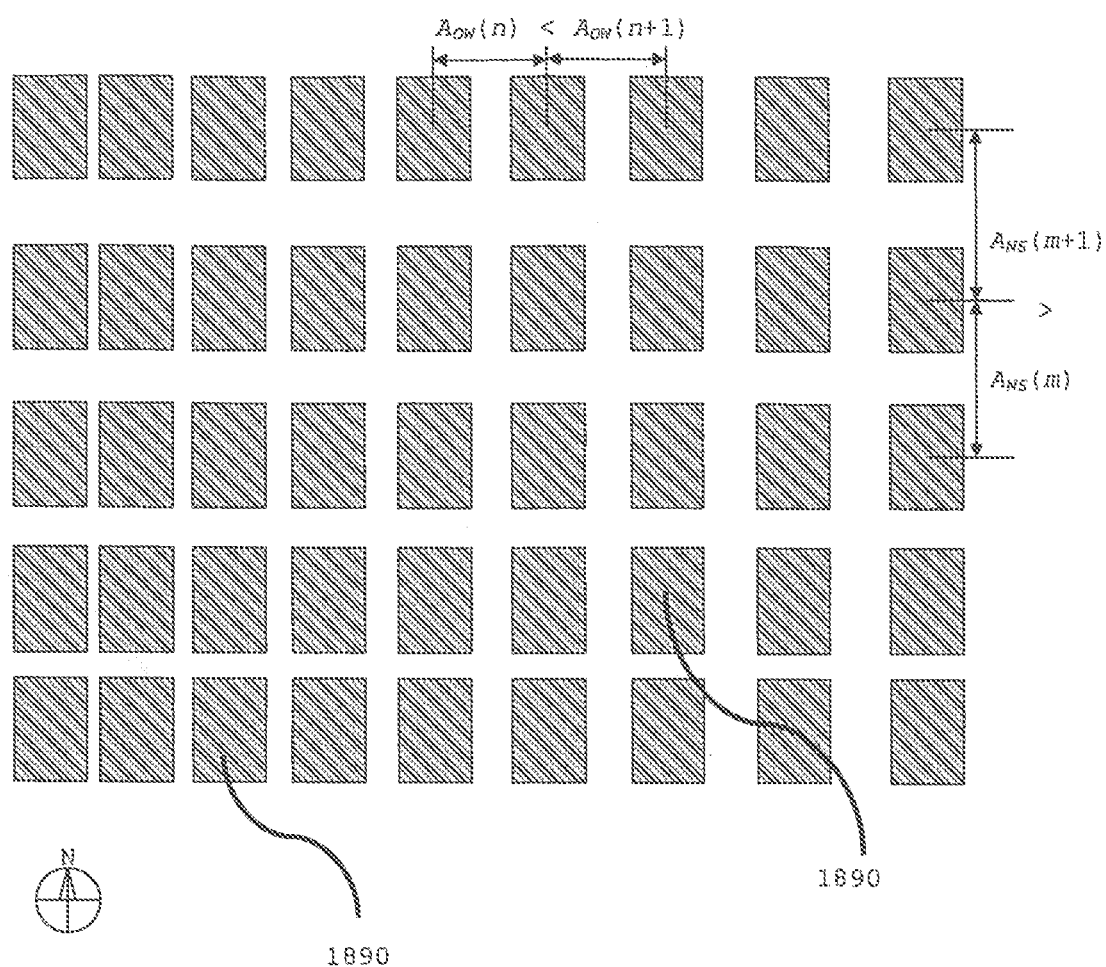

In FIG. 18 is shown a magnified feature from the plan view of a far field. The representation of the distances only shows the principle. The distances are not true to scale. One notices that for the situation depicted, where the receiver 1610 is located southwest of this field segment, the distances increase from west to east and from south to north.

Figure 19:
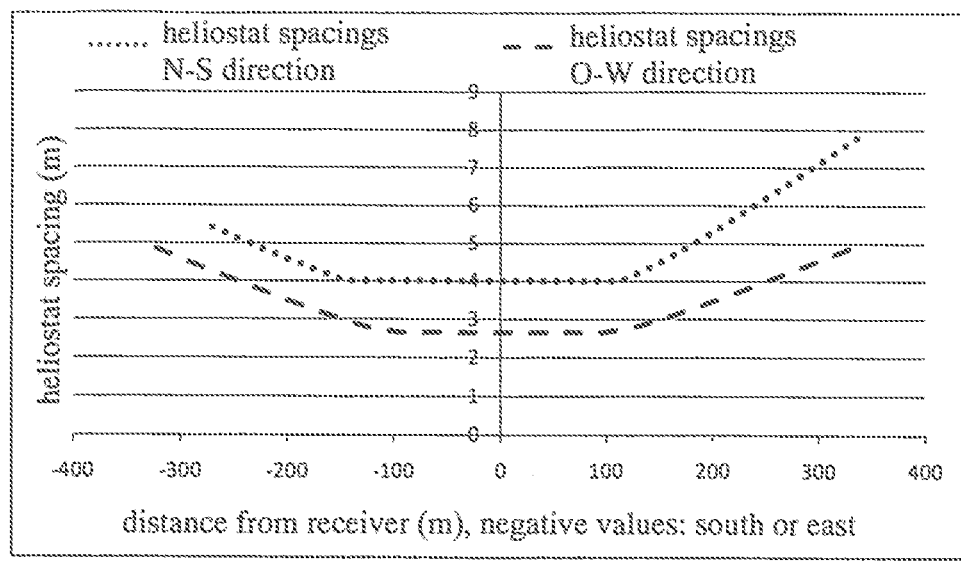

The increase in spacings of the heliostats in east-west and north-south direction is shown in FIG. 19.

The overall heliostat field extends in the north-south direction from 340 m north of the receiver 1610 to 285 m south of the receiver 1610 and in the east-west direction from 330 m east of the receiver to 330 m west of the receiver 1610.

The reflector surface density for the overall heliostat field $\rho_{total}$ is $\rho_{total}=52\%$ The circumference of the heliostat field in FIG. 16 describes a shape that runs outside a circle and at the same time inside a square. The center of the heliostat field lies around 25 m north of the receiver 1610, as is clear from the scale markings shown in FIG. 16. The receiver 1610 is displaced around 25 m from the center of the field to the south. The diameter of the heliostat field is around 700 m and thus around 4.5×$H_R$.

The heliostat field is continuous and will only be interrupted for the footpoints of the support structure if the technical implementation of the span of the support structure should require footpoints within the heliostat field.

Summary of the Essential Features of Sample Embodiment 1

Receiver height $H_R$: 150 m above heliostat field.

Area of the receiver aperture: 12.5 m×12.5 m=156.25 m².

Receiver orientation: normal vector of the aperture area of the receiver 1610 perpendicular downwardly directed, as shown in FIG. 15.

Support structure: arch system, as in FIG. 14a, spanning east-west across the heliostat field, consisting of near field 1636 and far field 1638.

Heliostat field with constant reflector surface density ρ in the near field 1636, which is equal to the maximum reflector surface density $ρ_{max}$ of around 68%.

1. Heliostats with rigid horizontal axle suspension for large mounting density within a row in the east-west direction or alternatively within a row in the north-south direction.
2. Heliostat field has in the near region a reflector surface density $ρ=ρ_{max}$=68%>60%.
3. Heliostat field extends in the north, east, south and west direction about the receiver and constitutes a continuous (uninterrupted) surface.

In the far field, spacings increase between the heliostats in the east-west and north-south direction.

Reflector surface density for the overall heliostat field $ρ_{total}$ is $ρ_{total}$=52%.

Heliostats with rigid horizontal axle suspension for large mounting density in the east-west direction.

Dimensions of the near field 1636: 85 m east to 85 m west of the receiver and 115 m north of the receiver and 150 m south of the receiver 1610.

Sample Embodiment 2

A further sample design for a central receiver solar system based on this patent was designed with the following properties, making use of the invented type of heliostats with rigid quasipolar axle suspension (FQA):

Assumptions for Design of the Central Receiver Solar System

Designed time: 21 June, 12 noon, solar time.

Location: latitude 34° N, north latitude, (e.g., North Africa or Southern California, USA).

Assumption: direct normal radiation (solar radiation power) at the designed time: 1000 W/m².

Receiver

Figure 20:
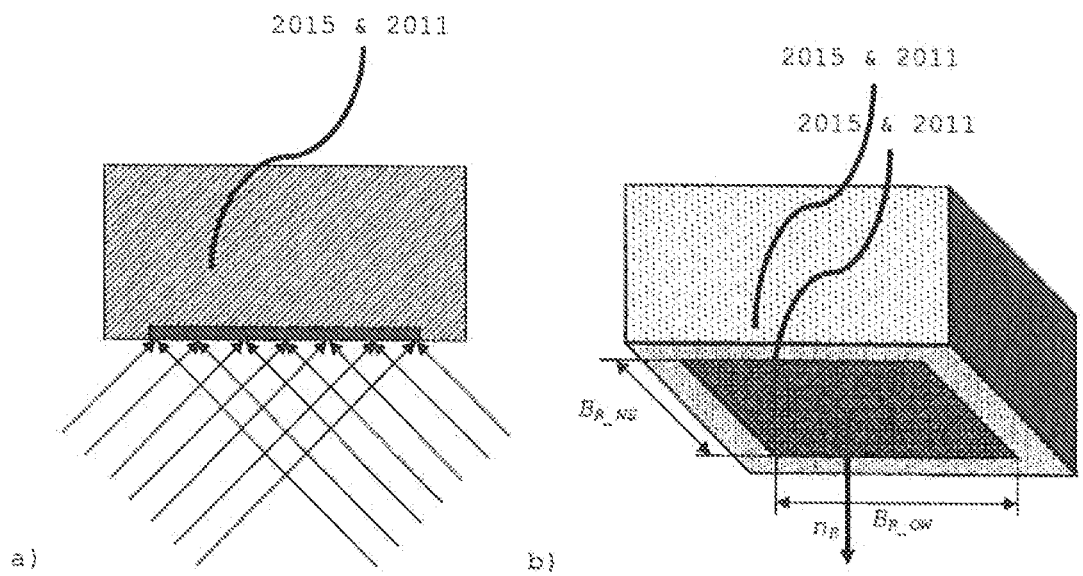

The receiver used is a receiver with external absorber, as shown in FIG. 20, there is an absorber 2015 at one side of the receiver. The surface of the absorber 2015 is thus also equal to the optical opening of the receiver, or aperture 2011. In other cases, the absorber 2015 can also have a nonflat surface. The normal vector $n_R$ of the absorber surface points downward. $B_{R\_NS}$ is the width of the rectangular absorber 2015 in the north-south direction and $B_{R\_EW}$ in the east-west direction. For the dimensions of the absorber 2015, as shown in FIG. 20:

$$B_{R\_NS}=12.5m, B_{R\_EW}=12.5m(156.25m^2)$$

For the height of the receiver above the heliostat field, the receiver height, we have $H_R$=150 m.

Receiver Support Structure

The receiver is suspended from a support structure, which holds the receiver freely over the heliostat field. This can be, for example, an arch system with two footpoints, as shown in FIG. 14a. The arch would stretch from east to west across the heliostat field.

Heliostats

The heliostats 1290 with FQA are composed in groups of 6 heliostats, while five groups of heliostats 1283 are composed into a module 1280 with a common support system, consisting of a support frame 1285 and legs 1287, as shown in FIG. 12.

Reflector surface $F_{Hel}=L_{Hel}×B_{Hel}=1.36425m^2$.

$L_{Hel}$=3.21m(length),$B_{Hel}$=0.425m(width).
See FIG. 13.

The intervals $Z_{NS}$ between the six heliostats 1390 within a group of heliostats 1383 are 0.05 m, similar to that in FIG. 13. The spacings $A_{EW}$ between the five groups of heliostats 1283 are the same within a module 1280. However, the spacings $A_{EW}$ between the groups of heliostats 1283 can differ from one module 1280 to another.

The heliostats are curved and concentrating along the length with a focal distance of 300 m.

Heliostat Field

The heliostat field consists of a plurality of modules 1280 of heliostats with FQA having coupled tracking about the first and second rotary axle within the groups of heliostats 1283.

Figure 21:
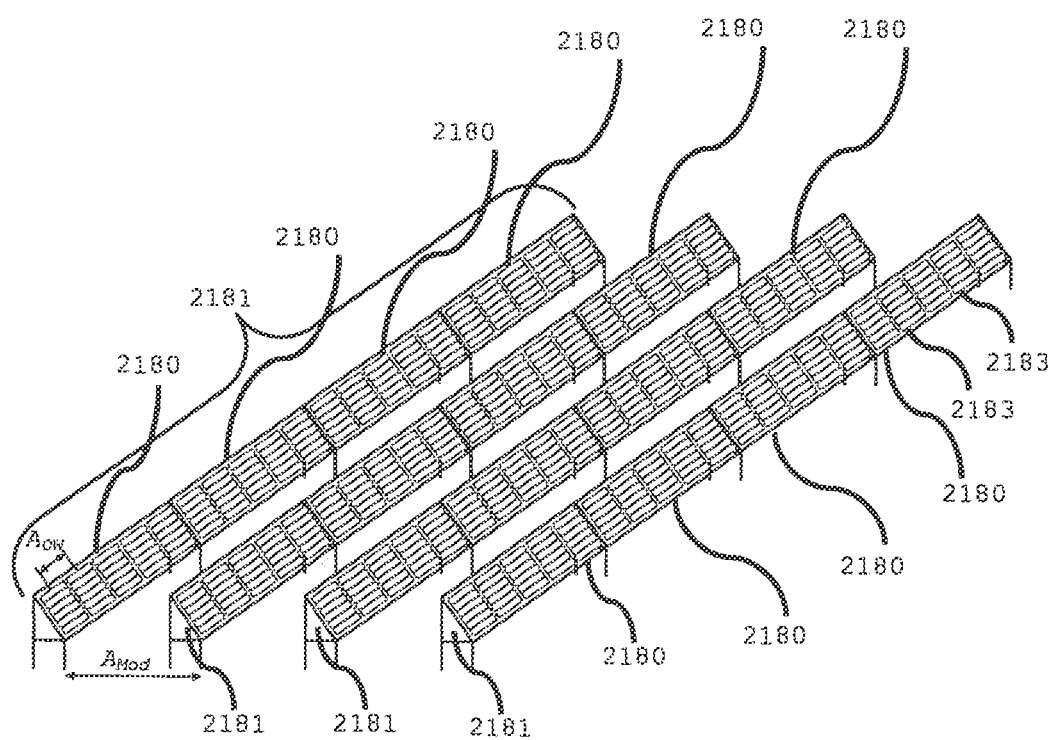

The heliostats with FQA are set up in parallel rows of modules 2180 of heliostats with FQA in the east-west direction, as shown in FIG. 21 in a perspective view for four rows of four modules each. In the situation shown in FIG. 21, the intervals $A_{EW}$ of the groups of heliostats 2183 within the modules 2180 are constant, as are the intervals between the rows of modules 2180 and also the angle α. This is characteristic of a segment from the near field. The distances, angles and magnitudes are only for scale.

The heliostat field consists of a near field 2236 and a far field 2238.

Figure 22:
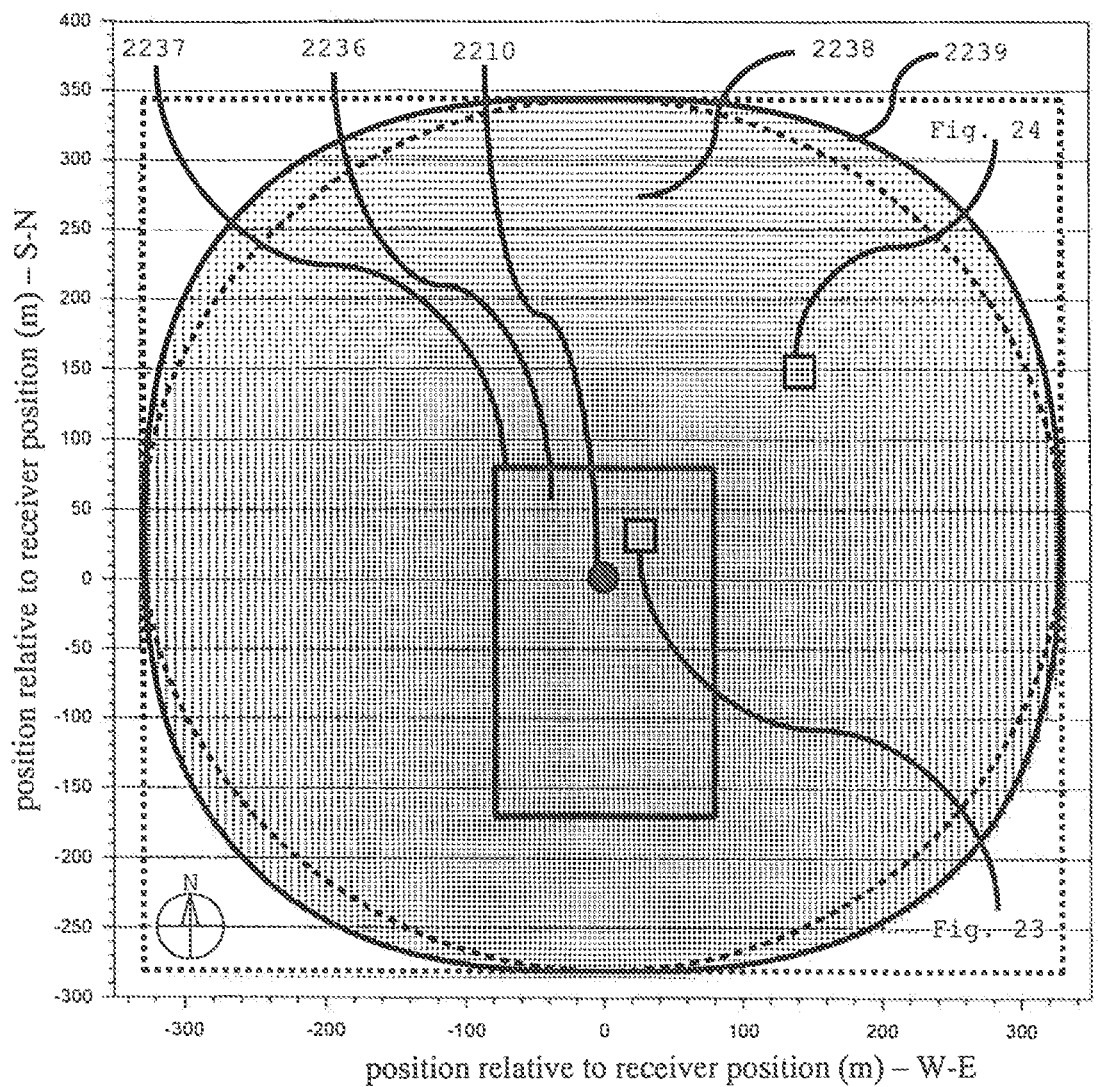

In FIG. 22 is depicted the described heliostat field, consisting of a near field 2236 and the far field 2238, shown in a plan view, where each individual point represents the position of a group of heliostats 1383, as shown in FIG. 13. The zero point of the system of coordinates is defined by the position of the center of the receiver 2210, represented here by a larger point, not drawn to scale. The outer margin of the near field 2237 is at the same time the border with the far field. The outer margin of the far field is at the same time the outer margin of the entire heliostat field 2239.

Figure 23:
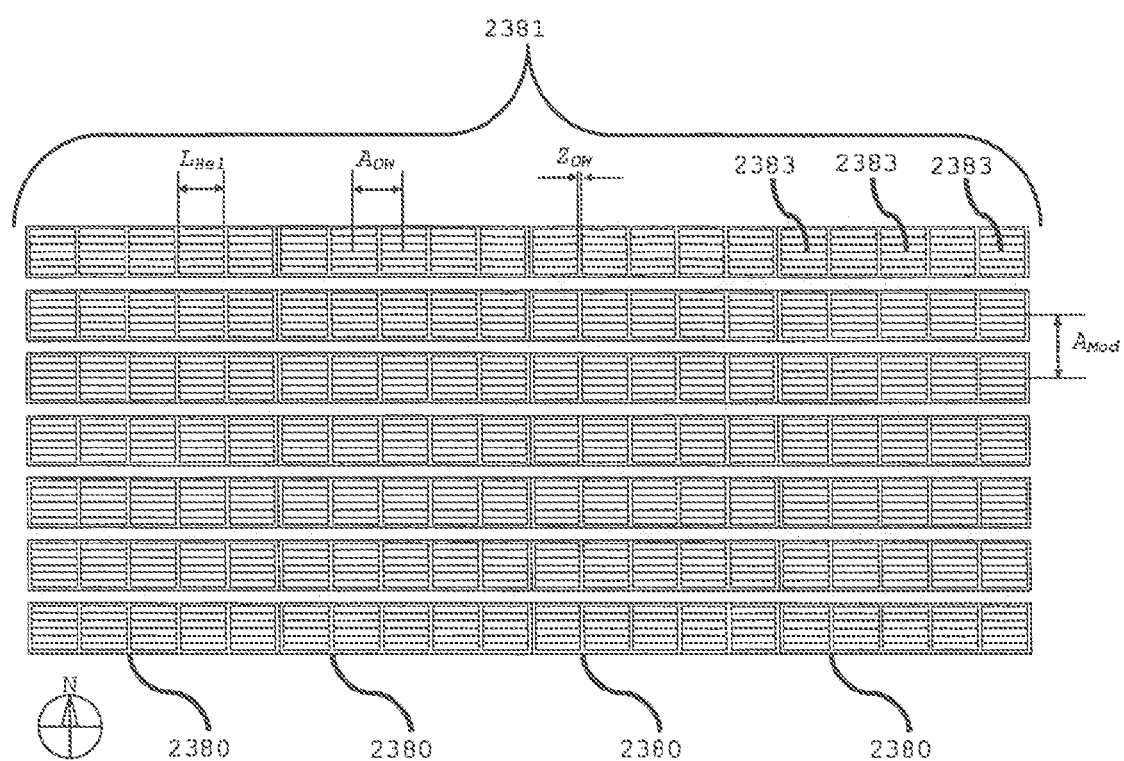

In the near field 2236 the spacings $A_{EW}$ of the groups of heliostats are constant in the east-west direction and set up with the maximum reflector surface density $ρ_{max}$, as is better seen from the magnified cutout of the plan view of the near field in FIG. 23. The reflector surface density ρ in the near field is equal to the maximum reflector surface density $ρ_{max}$ in the heliostat field.

The near region of the heliostat field extends, according to FIG. 22, in the east-west direction from 80 m east of the receiver to 80 m west of the receiver and in the north-south direction from 83 m north of the receiver to 173 m south of the receiver.

In FIG. 23 is shown a feature from the plan view of a near field, not drawn true to scale. The spacings $A_{Mod}$ of the module rows in the north-south direction are equal in the near field, as are the spacings $A_{EW}$ of the heliostats within the module rows in the east-west direction.

In the east-west direction, the heliostats in the near field are set up with spacings $A_{EW}$ of 3.61 m, i.e., each time there is an interval $Z_{EW}$ of 0.4 m between the reflectors with length $L_{Hel}$ of 3.21 m when the reflectors are oriented parallel, as shown.

The large mounting density within the east-west rows of around 89% (=3.21 m/3.61 m) is possible thanks to the use of heliostats with FQA and spatial volumes of the heliostats needed for free movement based on reflectors having a substantially longer length $L_{Hel}$ than width $B_{Hel}$ in the east-west direction ($L_{Hel} > 6 \times B_{Hel}$), as shown in FIG. 12. The use of heliostats with FQA even allows a fundamentally larger mounting density within the east-west rows when the installation and fabrication are precise and local safety standards are fulfilled.

In the north-south direction the module rows are set up in the near field with spacings $A_{Mod}$ of 3.20 m, i.e., from $B_{Hel} = 0.425$ m for every six heliostats per group there is a mounting density in the north-south direction of 80% (=6 × 0.425 m/3.20 m). The mounting density of the rows can also be fundamentally higher if the installation and fabrication are precise and local safety standards are fulfilled.

From the combination of the mounting density in the east-west and in the north-south, one gets a constant reflector surface density in the near field of $\rho_{max}$=around 71%.

In the far field, the spacings increase with increasing distance from the receiver 2210 both in the east-west and north-south orientation. In the far field the spacings of the heliostats in the east-west direction grow from 3.61 m to 6.39 m and the spacings of the module rows in the north-south direction from 3.20 m to 6.63 m.

Figure 24:
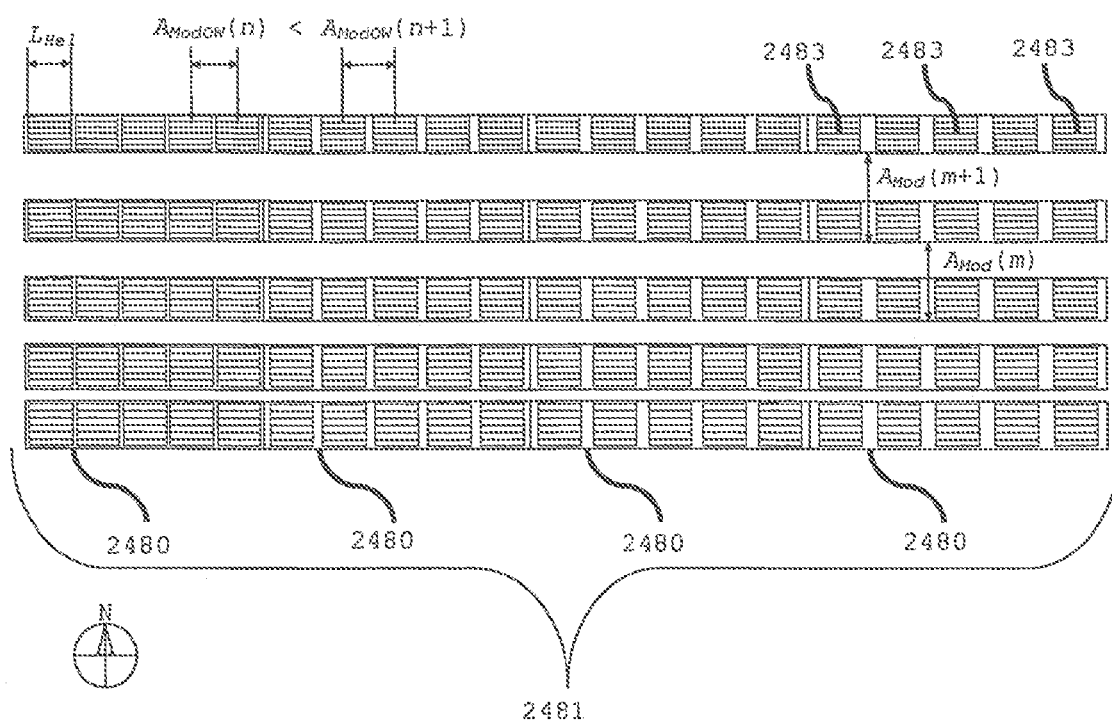

In FIG. 24 is shown a magnified feature from the plan view of a far field with heliostats having FQA. The representation of the distances only shows the principle. The distances are not true to scale. One notices that for the situation depicted, where the receiver 2210 is located southwest of this field segment, the distances increase from west to east and from south to north.

Figure 25:
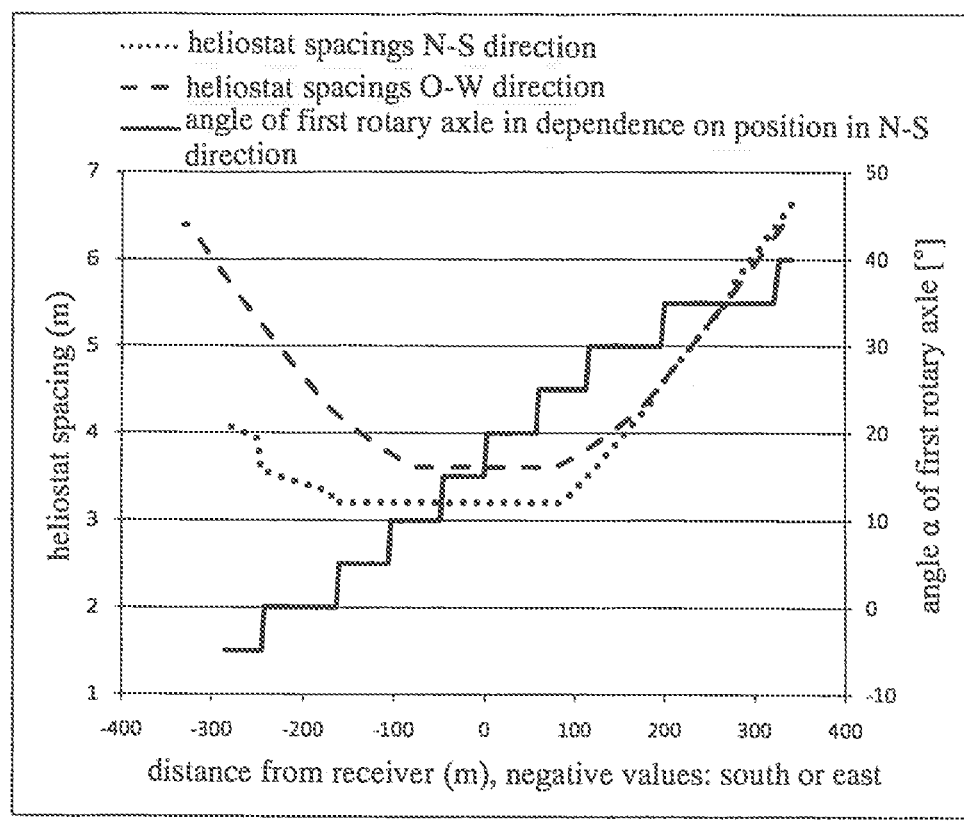

The angle $\alpha$ of the mounting surface and first rotary axle relative to the overall ground surface is a maximum for the module rows at the northern end of the heliostat field and diminishes toward the south, as also shown in FIG. 25. One notices that the angle $\alpha$ changes in steps of 5°. This is done for technical production considerations; purely theoretically, the angle $\alpha$ could also vary continuously. Furthermore, it should be noted that the angle $\alpha$ can also become negative to the south of the receiver, while positive values mean that the rotary axle is tilted such that the higher end points in the direction of the earth's pole (north), while negative values mean that the higher end of the rotary axle points in the direction of the equator (south).

The overall heliostat field extends in the north-south direction from 340 m north of the receiver 2210 to 285 m south of the receiver 2210 and in the east-west direction from 330 m east of the receiver to 330 m west of the receiver 2210.

The reflector surface density for the overall heliostat field $\rho_{total}$ is $\rho_{total}=51\%$ The circumference of the heliostat field in FIG. 22 describes a shape that runs outside a circle and at the same time inside a square. The center of the heliostat field lies around 25 m north of the receiver 2210, as is clear from the scale markings shown in FIG. 22. The receiver 2210 is displaced around 25 m from the center of the field to the south. The diameter of the heliostat field is around 700 m and thus around $4.5 \times H_R$.

The heliostat field is continuous and will only be interrupted for the footpoints of the support structure if the technical implementation of the span of the support structure should require footpoints within the heliostat field.

Summary of the Essential Features of Sample Embodiment 2

Receiver height $H_R$: 150 m above heliostat field.
Area of the receiver absorber: 12.5 m×12.5 m=156.25 m².
Receiver orientation: normal vector of the absorber area of the receiver 2210 perpendicular downwardly directed, as shown in FIG. 20.

Support structure: arch system, as in FIG. 14a, spanning east-west across the heliostat field, consisting of near field 2236 and far field 2238.

Heliostat field with constant reflector surface density $\rho$ in the near field 2236, which is equal to the maximum reflector surface density $\rho_{max}$ of around 71%.

1. Heliostats with rigid quasipolar axle suspension for large reflector surface density.
2. Heliostat field has in the near region a reflector surface density $\rho = \rho_{max} = 71\% > 60\%$.
3. Heliostat field extends in the north, east, south and west direction about the receiver and constitutes a continuous (uninterrupted) surface.

In the far field increasing spacings between the module rows of the heliostats in the north-south direction and the heliostats in the east-west direction.

Reflector surface density for the overall heliostat field $\rho_{total}$ is $\rho_{total}=51\%$.

Heliostats with rigid quasipolar axle suspension for large reflector surface density.

Dimensions of the near field 2236: 83 m east to 83 m west of the receiver and 80 m north of the receiver and 173 m south of the receiver 2210.

In the far field 2238 increasing spacings between the heliostats in the east-west direction and between the module rows in the north-south direction.

Sample Embodiment 3

A further sample design for a small central receiver solar system based on this patent making use of heliostats with rigid horizontal axle suspension in a heliostat field consisting solely of a near field and where the support structure is a revolving tower crane with jib, enabling movement of the receiver in up to three dimensions:

Assumptions for Design of the Central Receiver Solar System

Designed time: 21 June, 12 noon, solar time.
Location: latitude 34° N, north latitude, (e.g., North Africa or Southern California, USA).
Assumption: direct normal radiation (solar radiation power) at the designed time: 1000 W/m².
Radiation power (thermal power in Megawatt—$MW_{th}$) on the target surface of the receiver at the design time: 2 $MW_{th}$.
Receiver The receiver used is a hohlraum receiver, as depicted in FIG. 15. The normal vector $n_R$ of the aperture surface points downward. $B_{R\_NS}$ is the width of the rectangular aperture 1511 in the north-south direction and $B_{R\_EW}$ that in the east-west direction. For the dimensions of the aperture 1511 of the hohlraum receiver, as shown in FIG. 15:

$$B_{R\_NS}=3m, B_{R\_EW}=6m (18m^2)$$

For the height of the receiver above the heliostat field, the receiver height, we have $H_R=45$ m. Receiver height above the heliostat field: $H_R=45$ m.

Receiver Support Structure

Figure 26:
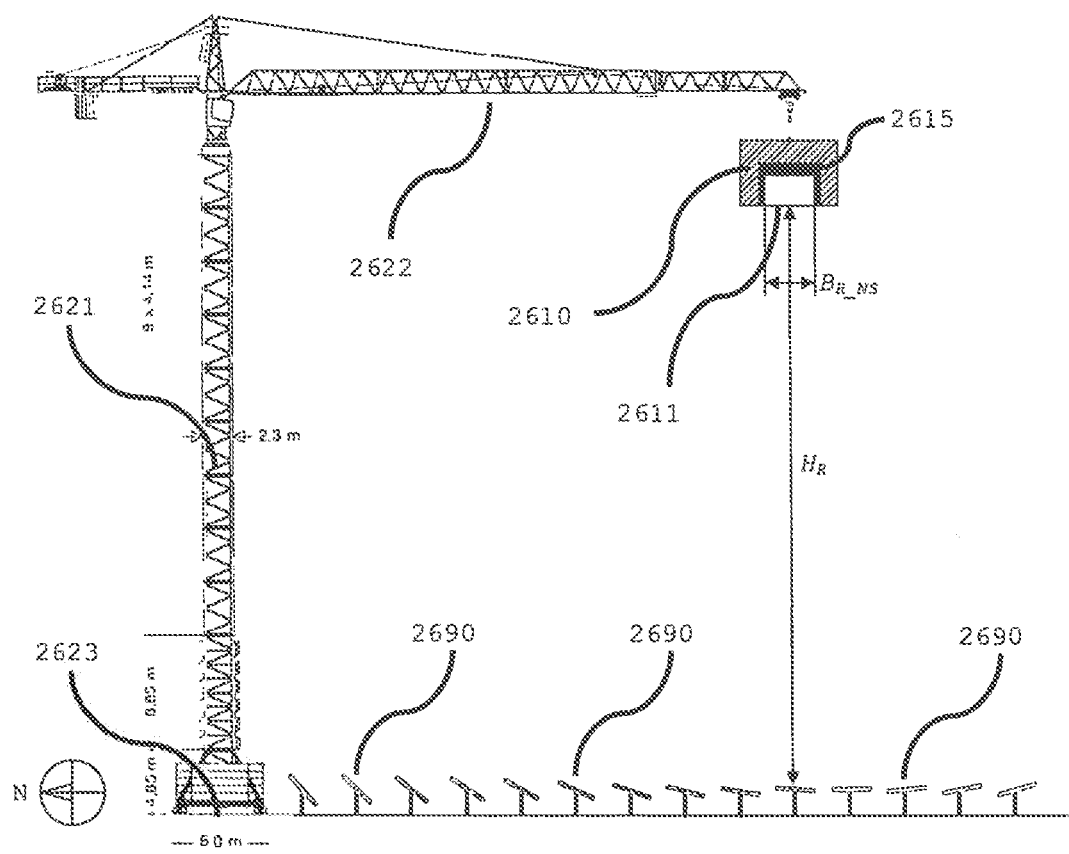

The support structure, as shown in FIG. 26, is a revolving tower crane, consisting of a vertical support structure 2621 and a jib 2622 from which a receiver 2610 is suspended above the heliostat field. The footpoint 2623 of the vertical support structure receiver height of the revolving tower crane is north of the heliostat field.

Figure 27:
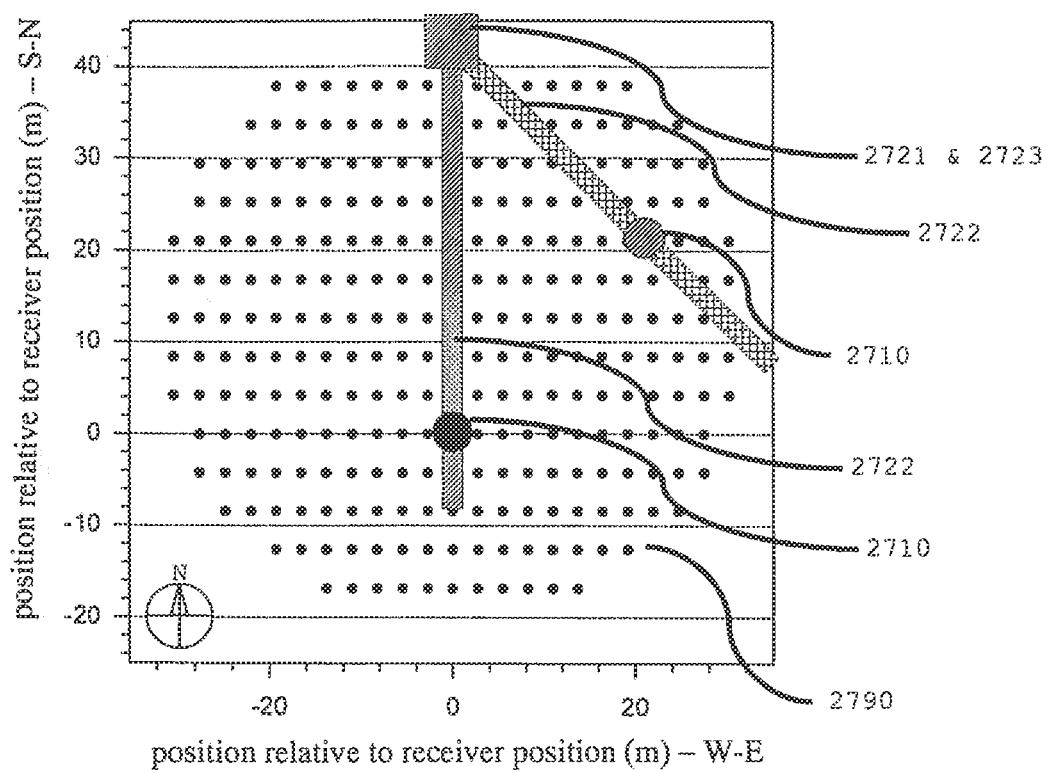

As can be seen in FIG. 27, the jib 2722 can be turned about a vertical rotary axle in the vertical support structure 2721. Furthermore, the receiver 2710 can be moved back and forth along the jib 2722. In this way, the position of the receiver 2710 can be changed according to the height of the sun and thus the efficiency of the heliostat field can be optimized. It will be noted that the receiver 2710 in the two jib positions depicted is likewise situated in different positions along the jib 2722. The position in which the receiver 2710 is situated above the zero point of the heliostat field is the situation in which the sun is located exactly south of the heliostat field at midday, while the other position represents the situation when the sun is situated northeast of the heliostat field in the morning in summertime.

Essentially it is also possible for the position of the receiver 2710 to vary in height $H_R$.

Heliostats

Heliostats with rigid horizontal axle suspension (FHA)

Reflector surface $F_{Hel}=L_{Hel} \times B_{Hel}=7.2225 m^2$.

$L_{Hel}=3.21 m$(length), $B_{Hel}=2.25 m$(width).

The reflectors of the heliostats are curved and concentrating along the length with a focal distance of 49.5 m.

Heliostat Field

The heliostats are set up in parallel rows in the east-west direction, while the heliostats also stand in rows in the north-south direction. See FIG. 27. In other layouts, the heliostats of neighboring east-west rows can also be staggered from each other by half the heliostat spacing $A_{EW}$ (see FIG. 17), as in FIG. 10.

The heliostat field consists of a near field and no far field.

In FIG. 27 is depicted the described heliostat field, consisting of a near field and no far field, shown in a plan view, where each individual point represents the position of a single heliostat in the north-south direction and east-west direction. The zero point of the system of coordinates is defined by the position of the center of the receiver 2710, represented here by a larger point, not drawn to scale.

In the entire heliostat field the heliostats 2790 are set up at constant spacing from each other with the maximum reflector surface density $\rho_{max}$, as is evident from the plan view in FIG. 27. The reflector surface density $\rho$ of the entire heliostat field is thus equal to the maximum reflector surface density $\rho_{max}$ in the heliostat field.

In the east-west direction, the heliostats in the heliostat field are set up with spacings $A_{EW}$ of 2.75 m, i.e., each time there is an interval $Z_{EW}$ of 0.5 m between the reflectors with width $B_{Hel}$ of 2.25 m when these are located in the horizontal park position, where the reflectors are horizontal and the long sides of the heliostats are oriented in the north-south direction, as shown in the plan view of FIG. 17.

The large mounting density within the east-west rows of around 82% (=2.25 m/2.75 m) is possible thanks to the use of heliostats with rigid horizontal axle suspension (FHA), as described in WO 02/070966 A1, WO 2008/092194 A1 and WO 2008/092195 A1.

In the north-south direction the heliostat rows are set up in the near field with spacings $A_{NS}$ of 4.21 m, i.e., each time there is an interval $Z_{NS}$ of 1.0 m between the reflectors with length $L_{Hel}=3.21$ m (and thus rows 3.21 m wide) when they are in the horizontal park position. See FIG. 17. The mounting density of the rows can also be fundamentally higher if the heliostat rows are staggered each time by half the heliostat spacing $A_{EW}$ (see FIG. 17), as shown in FIG. 10.

From the combination of the mounting density in the east-west and in the north-south, one gets a constant reflector surface density of $\rho_{max}$=around 62%

Contrary to sample design 1, this heliostat field consists solely of a near field with heliostats at constant spacing from each other.

The overall heliostat field extends in the north-south direction from around 38 m north of the receiver 2710 to 17 m south of the receiver 2710 and in the east-west direction from 33 m east of the receiver to 33 m west of the receiver 2710.

The circumference of the heliostat field in FIG. 27 describes roughly a circular shape. The center of the heliostat field lies around 10 m north of the receiver 2710, as is clear from the scale markings shown in FIG. 27. The receiver 2710 is displaced around 10 m from the center of the field to the south. The diameter of the heliostat field is around 60 m and thus around $1.3 \times H_R$.

The heliostat field is continuous throughout.

Summary of the Essential Features of Sample Embodiment 3

Receiver height $H_R$: 45 m above heliostat field.

Area of the receiver aperture: 3 m×6 m=18 $m^2$.

Receiver orientation: normal vector of the aperture area of the receiver 2710 perpendicular downwardly directed, as shown in FIG. 15 and FIG. 26.

Support structure: revolving tower crane, consisting of a vertical support structure 2621 and a jib 2622 for suspension-mounted receiver 2610 and with footpoint north of the heliostat field.

Heliostat field with constant reflector surface density $\rho$ corresponds to the maximum reflector surface density $\rho_{max}$ of around 71%.

1. Heliostats with rigid horizontal axle suspension for large mounting density within a row in the east-west direction.

2. Heliostat field with reflector surface density $\rho=\rho_{max}=\rho_{Total}=68\%>60\%$.

3. Heliostat field extends in the north, east, south and west direction about the receiver and constitutes a continuous (uninterrupted) surface.

No far field.

Reflector surface density for the overall heliostat field $\rho_{total}$ is $\rho_{total}=\rho=\rho_{max}=68\%$.

Procedure for the Design of Sample Embodiments 1 to 33

Figure 9:
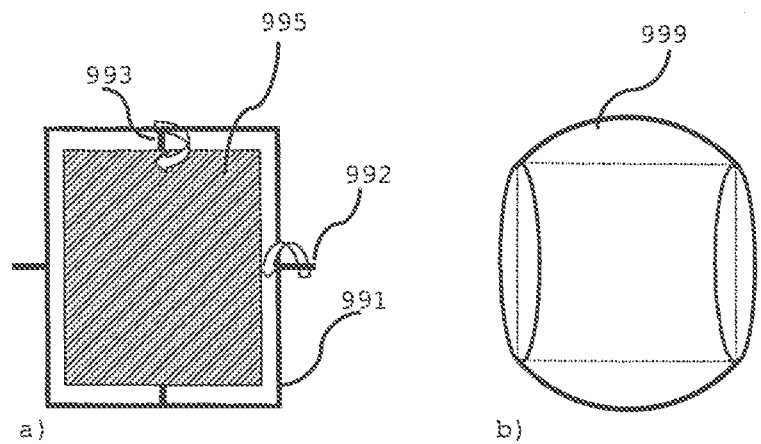

For design of the preceding sample embodiments 1 to 3, the following procedure was chosen in four preferably consecutive steps:

Method for the design of a heliostat field of a central receiver solar system, a) wherein, in the first step, a setup of heliostats (1790; 1290, 1390) is defined for a near field (1636; 2236) on a preferably level overall ground surface, having a reflector surface density p of p>60%, wherein the reflector surface density p is defined as the ratio of the overall reflector surface of a region of the heliostat field to the built-over ground surface of the same region of the heliostat field, wherein each heliostat has a reflector (795; 995) that can be moved about two rotary axles (792, 793; 992, 993), which reflects the solar radiation onto the target surface of one or more receivers (1610; 2210) during the changing position of the sun, wherein the target surface is an aperture (1511; 2011) or a thermal absorber (2015) or a photovoltaic absorber (2015) of the respective receiver (FIG. 15; FIG. 20), wherein for each heliostat the first rotary axle (992; 1292, 1392) is configured parallel to the mounting surface (FIG. 9; FIG. 12, FIG. 13) and a group of heliostats with a common mounting surface are set up in a row, so that the first rotary axle (992; 1292, 1392; 1792) of the heliostats (1290, 1390; 1790) in the particular group lie on the same line, i.e., are aligned with each other, wherein the reflector (995; 1295, 1395; 1795) of each heliostat is rectangular and preferably longer in the direction of the second rotary axle (993; 1293, 1393) than in the direction perpendicular to it and b) wherein the common mounting surface of one or more groups of heliostats (1283; 1383) can be inclined to the overall ground surface by an angle α (FIG. 12) dependent on the position to the receiver, wherein in the second step the positions of the heliostats are determined with the distance from the receiver (1610; 2210), calculating how far the near field (1636; 2236) with the same reflector surface density p reaches around the receiver and where the far field (1638; 2238) then begins at the near field, wherein in the far field the distances in the east-west direction and north-south direction must be increased to prevent or reduce the mutual blocking of the heliostats as much as possible, wherein blocking means that a heliostat at least partly covers the beam path from the reflector of an adjacent heliostat to the target surface of the receiver, c) wherein in the third step the radiation power which the respective heliostats transfer onto the target surface of the receiver (1610; 2210) is calculated and preferably those heliostats are chosen for the heliostat field that contribute at the designed time or other determined times the highest component to the radiation power on the target surface of the receiver, wherein the heliostat field is formed at least by a near field and, depending on the required radiation power on the target surface of the receiver, also a far field, wherein, if a receiver height $H_R$ of at least 100 m is chosen, a far field is provided and the largest diameter $D_H$ of the heliostat field is preferably less than six times the receiver height $H_R$, wherein in the fourth step a support structure (FIG. 14) is chosen, which is suitable to holding the receiver (1410) in the defined position above the heliostat field, this support structure being configured as i. an arch (FIG. 14a),
ii. or a truss (FIG. 14b)
iii. or a suspended cable construction (FIG. 14c), wherein these three support structures i, ii and iii, each with at least two footpoints that are preferably located in the outer region or outside the heliostat field, iv. or a cranelike support system (FIG. 14d) with a jib or cantilever arm (1422) supporting the (1410), which extends across the heliostat field, wherein one or more footpoints of the cranelike support system is located either in the outer region or preferably outside of the heliostat field on the side of the receiver facing away from the equator, wherein the position of a receiver (2610, 2710) mounted on the jib (2622, 2722) can be changed in up to three dimensions, so that for the heliostat field determined in the third step different positions can be chosen for the receiver for particular positions of the sun in order to increase the efficiency of the heliostat field for the respective positions of the sun (FIG. 26, FIG. 27).

The following definitions are used in the application.

DEFINITIONS

Heliostat with rigid quasipolar axle suspension (FQA): a heliostat with FQA is a heliostat in which the first fixed rotary axle is parallel to a mounting surface which in turn is inclined by an angle α to the overall ground surface.

Group of heliostats: a plurality of heliostats with FQA that have a common mounting surface and a common first rotary axle, both of them having an angle α to the overall ground surface.

Module: a plurality of groups of heliostats all having a common mounting surface and parallel first rotary axles that are assembled into a module and carried by a common support system of support frame and legs.

Mounting surface: the mounting surface of a heliostat is a freely defined reference surface to which the first rotary axle is rigidly arranged.

First rotary axle: the first rotary axle is one of the two rotary axles of the heliostat, the first rotary axle being referenced to the mounting surface.

Second rotary axle: the second rotary axle is one of the two rotary axles of the heliostat, the second rotary axle being fixed relative to the reflector.

Normal vector of the receiver: the normal vector $n_R$ of the receiver is the vector of the normal to the target surface of the receiver.

Receiver width: the receiver width is the width of the target surface of the receiver or the side length of the target surface in the case of a rectangular target surface.

Shadowing: when heliostats shadow each other in the heliostat field, this means that one heliostat at least partly obscures the beam path from the sun to the reflector of a neighboring heliostat.

Blocking: when heliostats block each other in the heliostat field, this means that one heliostat is at least partly obscuring the beam path from the reflector of a neighboring heliostat to the target surface on the receiver.

Designed time: the designed time is the time for which a central receiver solar power plant is designed and the powers of the system, as well as the radiation power on the target surface of the receiver, are defined. Typically, the designed time is 12 o'clock midday, solar time, on the date of the summer solstice (June $21^{st}$ in the northern hemisphere).

Heliostat: a heliostat is a reflector which can be moved about two axles, which reflects the solar radiation onto a target point or target surface. The two-axle guidance ensures that the target point or the target surface are continually irradiated as the sun's position varies throughout the day, the heliostat having a first rotary axle and a second rotary axle perpendicular to the first, which is arranged on a mounting surface, wherein the first rotary axle is rigidly arranged relative to the mounting surface and the second rotary axle in relation to the reflector. The reflector of the present invention has a rectangular shape, where the shorter edge length is called the width $B_{Hel}$ and the longer edge length is called the length $L_{Hel}$. Thus, the rectangular reflector has a reflector surface $F_{Hel} = B_{Hel} \times L_{Hel}$.

Heliostats with rigid horizontal axle suspension. A heliostat with rigid horizontal axle suspension is a heliostat with two axles arranged perpendicular to each other, where the first axle is arranged horizontal and stationary, about which the second axle moves. In the present invention, a heliostat with a horizontal axle suspension is used as is described in detail by WO 2008/092194 A1, WO 2008/092195 A1 and WO 02/070966 A1 and in [8].

Figure 5:
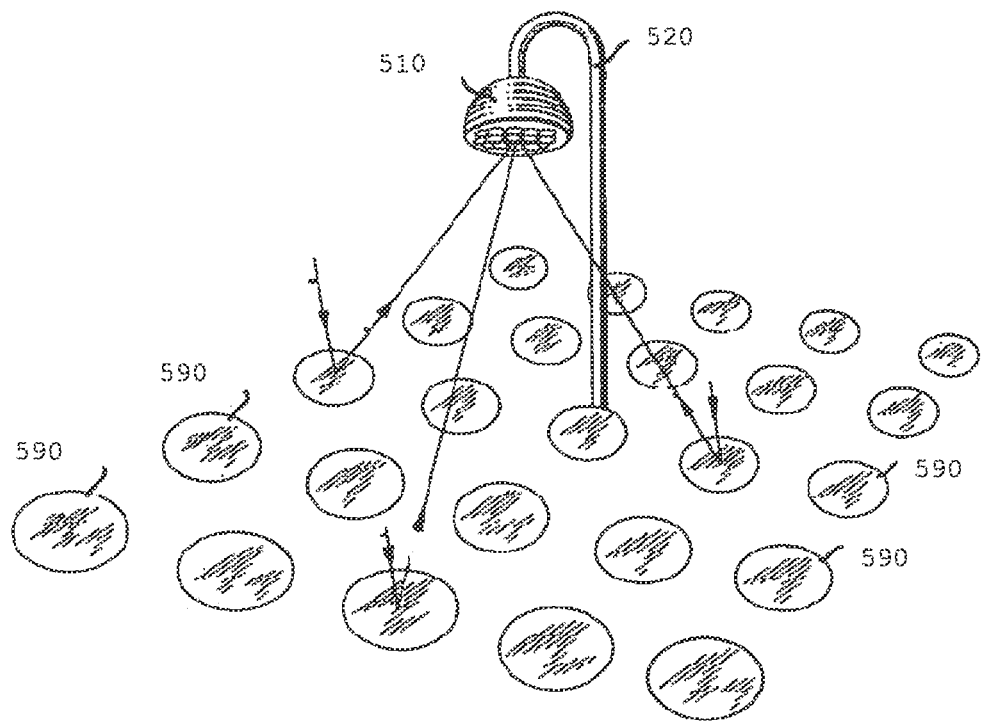

Heliostat field: a heliostat field is a field formed from a plurality of heliostats, which reflects the solar radiation onto a target point or a target surface of a receiver, whose principle is known from, for example, the U.S. Pat. No. 4,172,443 or U.S. Pat. No. 4,220,140, also see FIG. 1 and FIG. 5 borrowed from this.

Receiver: a receiver is a system which converts solar radiation into heat or, in the case of a photovoltaic receiver, directly into electric current. The heat from a thermal receiver is supplied to a heat transfer agent, which can be water, steam or air. The receiver is typically situated at the target point of the heliostat field. The principle of a receiver is known, for example, from the U.S. Pat. No. 4,172,443 or U.S. Pat. No. 4,220,140, also see FIG. 1 and FIG. 5 borrowed from this.

Hohlraum receiver: as shown in FIG. 15a, a hohlraum receiver is a receiver in which the surface absorbing the solar radiation, or absorber 1515, lies inside a cavity 1512. The radiation goes through the aperture 1511 and enters the cavity. The principle of such a hohlraum receiver is known, for example, from the U.S. Pat. No. 4,220,140 or WO 2008/153922 A1 and also from [9].

Absorber: the absorber is the part of the receiver on which the solar radiation impinges and, in the case of a thermal absorber, is converted into heat and given up to a heat transfer agent, such as is known for example from U.S. Pat. No. 4,220,140, or in the case of a photovoltaic absorber it consists of photovoltaic cells that convert the solar radiation directly into electric current.

Figure 1:
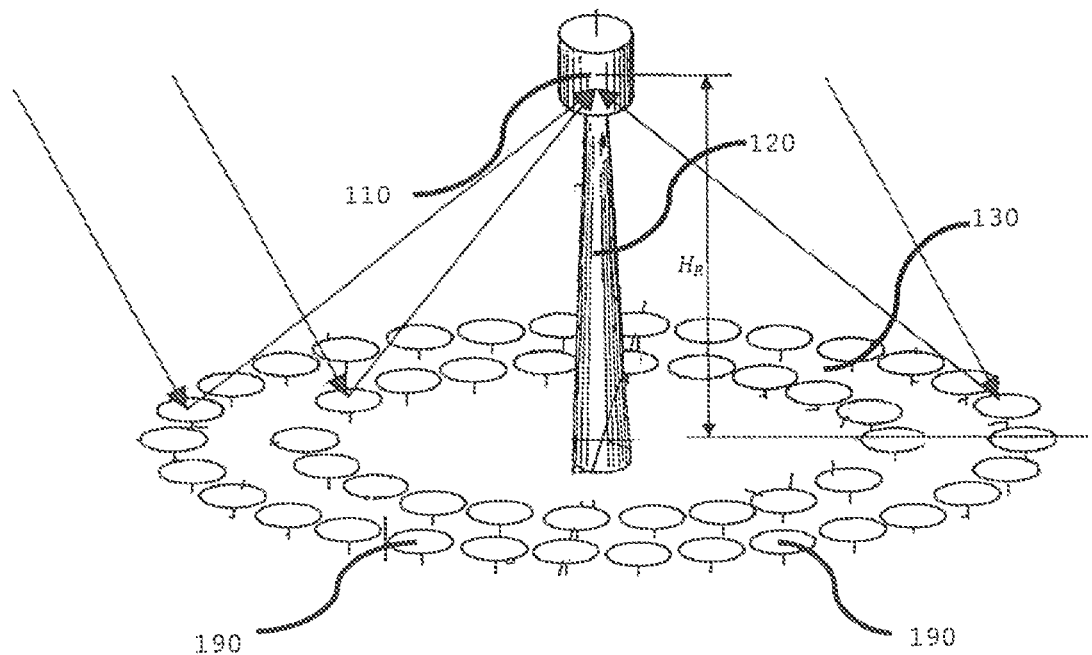
FIG. 1, a perspective view of a known solar tower system with a heliostat field that is composed of a plurality of heliostats, which concentrate the solar rays on a receiver, which is located on a tower (prior art per U.S. Pat. No. 4,172,443), FIG. 2, a schematic of a plan view of a known solar tower system with surrounding heliostat field (prior art), FIG. 3, a schematic of a plan view of a known solar tower system with a polar field, in this case for a system in the northern hemisphere with the heliostat field northward of the receiver and tower. (prior art), FIG. 4, a schematic of a plan view of a known solar tower system of Giovanni Francia with heliostat field underneath the receiver (prior art), FIG. 5, a perspective view of a known solar tower system with heliostat field underneath the receiver, which is suspended from a jib support structure (prior art per U.S. Pat. No. 4,220,140), FIG. 6, a plan view of a known solar tower system with north and south field (prior art per [7] and WO 2008/154521 A1), FIGS. 7 *a*) and *b*), each a schematic of a known heliostat with rigid vertical axle suspension (FVA) and *c*) a perspective view of the spatial volume required by the freely movable reflector (prior art from [8] and WO 2008/092195 A1), FIG. 8, a schematic of a plan view of the setup of heliostats with rigid vertical axle suspension (FVA) with maximum reflector surface density to avoid overlapping spatial volumes (prior art per [8]), FIG. 9 *a*) a schematic of a known heliostat with rigid horizontal axle suspension (FHA) and *b*) a perspective view of the spatial volume required by the freely movable reflector (prior art from [8] and WO 2008/092195 A1), FIG. 10, a schematic of a plan view of the setup of heliostats with rigid horizontal axle suspension (FHA) with maximum reflector surface density to avoid overlapping spatial volumes (prior art per [8]), FIG. 11, a cross section through a hohlraum receiver [cavity receiver] known from [9], where the concentrated solar radiation falls through the aperture into the hohlraum receiver and there impinges on the absorber, where the heat is supplied to a heat transfer agent, FIG. 12, a perspective view of an embodiment according to the invention of a module of heliostats with rigid quasipolar axle suspension (FQA), consisting of five groups of heliostats each with six heliostats, a common support system consisting of support frame and legs, while the first rotary axle, which is rigidly joined to the mounting surface, is parallel to the mounting surface, which in the drawing is spanned by the support frame and which is inclined by the angle α to the overall ground surface of the heliostat field, FIG. 13, a plan view of an embodiment according to the invention of a group of heliostats consisting of six heliostats with rigid quasipolar axle suspension (FQA), where the spatial volume of the heliostats permits a close positioning of the heliostats within the depicted group of heliostats and the tracking of the heliostats directly via the first rotary axle and the tracking via the second rotary axles 1393, which are parallel, are mechanically coupled via a common mechanism, FIG. 14, a survey of possible support structures of the embodiments of the invention for the central receiver solar system, each with suspended receiver having a) archlike support structure, b) a truss (triangular support structure), c) a suspended cable construction and d) a crane system as the support structure, consisting of a vertical support structure and a jib or cantilever arm from which the receiver is suspended, FIG. 15 a) a cross section through an embodiment of the invention for a hohlraum receiver and b) a perspective view of the bottom side of this hohlraum receiver, where the absorber is located in a cavity, and the solar radiation passes into the cavity through the optical opening, or aperture, and impinges on the absorber there, FIG. 16, a plan view of an embodiment of the invention for a central receiver solar system with partitioning of the heliostat field made of heliostats with FHA into near field and far field, where the near field extends underneath the receiver up to the rectangular margin and the far field extends from the margin of the near field to the margin of the heliostat field, FIG. 17, a magnified cutout of the plan view of the embodiment of the invention of FIG. 16 to show the setup of the heliostats with FHA in the near field, FIG. 18, a magnified cutout of the plan view of the embodiment of the invention of FIG. 16 to show the setup of the heliostats with FHA in the far field, the distances not being to scale, and n being the numbering of the heliostat rows in the west-east direction and m the numbering of the heliostat rows in the south-north direction, FIG. 19, a diagram for the spacings of the heliostats in the east-west and north-south direction in dependence on the distance from the receiver, FIG. 20 a) a cross section through an embodiment of the invention for a receiver with external absorber and b) a perspective view of the underside of the receiver with external absorber, where the absorber constitutes one side of the receiver, FIG. 21, a perspective view of the embodiment of the invention for four rows each of four modules of heliostats with FQA, set up in parallel east-west rows, FIG. 22, a plan view of an embodiment of the invention for a central receiver solar system with heliostats having FQA, where each point corresponds to a group of heliostats as shown in FIG. 13, with partitioning of the heliostat field into near and far field, the near field extending beneath the receiver out to the rectangular margin and the far field extending from the margin of the near field to the margin of the heliostat field, FIG. 23, a magnified cutout of the plan view, not drawn to scale, of the embodiment of the invention of FIG. 22 to show the setup of the heliostats with FQA in the near field, where the spacings $A_{mod}$ of the module rows in the north-south direction are equal in the near field, like the distances $A_{EW}$ of the heliostats within the module rows in the east-west direction, FIG. 24, a magnified cutout of the plan view, not drawn to scale, of the embodiment of the invention of FIG. 22 to show the setup of the heliostats with FQA in the far field, where the spacings $A_{mod}$ of the module rows in the north-south direction increase with distance from the receiver, like the spacings of the heliostats within the module rows in the east-west direction, while within a module the spacings of the heliostats in the east-west direction can remain the same and the angle α becomes larger with distance from the receiver, so that the module rows in plan view appear increasingly more narrow with distance from the receiver, so that $A_{mod}(m) < A_{mod}(m+1)$ and $A_{modEW}(n) < A_{modEW}(n+1)$, where n is the numbering of the modules in the west-east direction and m the numbering of the module rows in the south-north direction, FIG. 25, a diagram for the spacings of the heliostats in the east-west and north-south direction in dependence on the distance from the receiver for a heliostat field with heliostats having FQA and representation of the angle α of the particular modules of the heliostat field in dependence on the distance from the receiver in the north-south direction, where positive values indicate that the rotary axle is tilted so that the higher end points in the direction of the earth's pole, while negative values indicate that the higher end of the rotary axle points in the direction of the equator, FIG. 26, a cross section through an embodiment of the invention for a central receiver solar system with heliostat field and revolving tower crane as the support structure, which representation has been taken from [10], consisting of a vertical support structure and a jib for the receiver and a field of heliostats with FHA, consisting of near field with no far field, where the position of the receiver can change in three dimensions, FIG. 27, a plan view of an embodiment of the invention for a central receiver solar system with heliostat field, where each point corresponds to a heliostat, and revolving tower crane as the support structure, consisting of vertical support structure and footpoint northward outside the heliostat field and a jib to hold the receiver above the heliostat field, while the jib can be turned by a vertical rotary axle in the vertical support structure and the receiver can be moved back and forth along the jib, shown by way of example, while the position in which the receiver is situated above the zero point of the heliostat field is the situation in which the sun is located precisely south of the heliostat field at midday, while the other position constitutes the situation when the sun is located northeast of the heliostat field in the morning in summertime.
Figure 2:
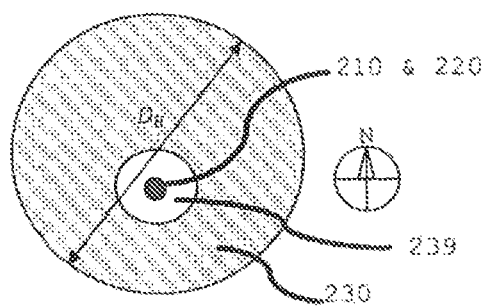
Figure 3:
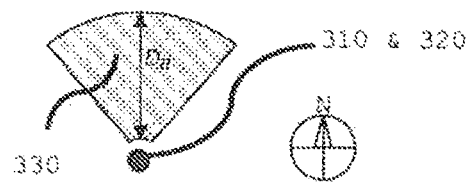
Figure 4:
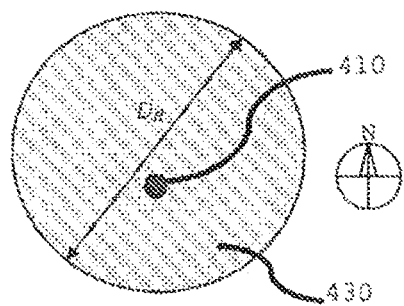

Receiver with external absorber: a receiver with external absorber is a receiver in which the absorbing surface is part of the external surface of the receiver, such as the envelope surface of a cylindrical receiver, as is known from the U.S. Pat. No. 4,172,443, from which FIG. 1 is borrowed, showing the cylindrical envelope surface of the receiver 110, or in FIG. 15b and FIG. 20b where the absorber 1515/2015 is situated on an outer side of the receiver.

Aperture: the aperture is the optical entrance opening of a hohlraum receiver, such as is known from [9] of WO 2008/153922 A1 and shown in FIG. 15.

Target surface: depending on the kind of receiver, the aperture, the thermal absorber or the photovoltaic absorber can be the target surface of the receiver.

Near field: the near field of a heliostat field in the present invention is defined as the portion of the heliostat field that extends underneath the receiver and has a constant reflector surface density $\rho$. That is, the heliostats are set up at constant spacings from each other. A heliostat field can also consist solely of a near field.

Far field: the far field of a heliostat field is defined as the part of the heliostat field that wholly or partly surrounds the receiver with a certain horizontal spacing and where the reflector surface density $\rho$ decreases with increasing horizontal distance from the receiver. A heliostat field can also consist solely of a far field.

Reflector surface: the reflector surface is the surface $F_{Hel}$ of the reflector of an individual heliostat.

Reflector surface density $\rho$: the reflector surface density $\rho$ is the ratio of the reflector surface of a region of the heliostat field to the ground surface of this region of the heliostat field.

Maximum reflector surface density $\rho_{max}$: the maximum reflector surface density $\rho_{max}$ corresponds to the highest value of the reflector surface density occurring in the entire heliostat field.

Total reflector surface density $\rho_{Total}$: the total reflector surface density $\rho_{Total}$ is the ratio of the reflector surface of the entire heliostat field to the ground surface of the entire heliostat field.

Heliostat width: the heliostat width is the width $B_{Hel}$ of the rectangular reflector of the heliostat and in the present invention, as shown in FIG. 17, it is always less than the length $L_{Hel}$ of the reflector.

Heliostat length: the heliostat length corresponds to the length $L_{Hel}$ of the rectangular reflector of the heliostat and in the present invention, as shown in FIG. 17, it is always greater than or equal to the width $B_{Hel}$ of the reflector.

Heliostat rows: row of heliostats, wherein the heliostats as shown in FIG. 17 are set up in a line with the first rotary axle, the rigid horizontal axle 1792 of the heliostats with rigid horizontal axle suspension.

Mounting density within a heliostat row: the mounting density within a heliostat row is the ratio of the width $B_{Hel}$ of the reflector of the heliostats to the spacing $A_{EW}$ of two neighboring heliostats within a row. In this case, the spacing $A_{EW}$ of two neighboring heliostats is defined as the spacing of the midpoints of two neighboring reflectors of these heliostats, as shown in FIG. 17.

Mounting density of heliostat rows: the mounting density of heliostat rows, as shown in FIG. 17, is defined as the ratio of the width of the heliostat row, which is equal to the length $L_{Hel}$ of the reflectors of the heliostats, to the spacing $A_{NS}$ of two neighboring heliostat rows, where the spacing of two neighboring heliostat rows is defined as the spacing of the midpoints of the two neighboring heliostat rows.

Diameter of a heliostat field $D_{Hel}$: the diameter $D_{Hel}$ of a heliostat field, as shown in FIGS. 2, 3, 4 and 6, is defined as the distance of the heliostats furthest removed from each other.

Receiver height $H_R$: the receiver height $H_R$, as shown in FIG. 1, is defined as the vertical distance of the midpoint of the absorber surface of a receiver with external absorber or the receiver aperture of a hohlraum receiver from the plane defined by the midpoints of the reflectors of the heliostats of the heliostat field. The receiver height is used as a unit quantity against which other quantities are measured, such as the heliostat field size.

REFERENCES

[1] Winter, C.-J.; Sizmann, R. L.; Vant-Hull, L. L.: Solar Power Plants, Berlin, Heidelberg, New York: Springer, 1991

[2] Burgalet, J-I; Arias, S; Salbidegoitia I. B., Operative advantage of a central tower solar plant with thermal storage system, in SolarPACES 2009, Conference Proceedings, 1-18 Sep. 2009, Berlin, Germany, ISBN 978-3-00-028755-8

[3] Gould, B.: Molten Salt Power Towers, Presentation at DOE Program Review, Austin, Tex. 23 Apr. 2008

[4] Koll, G.; Schwarzbözl, P.; Hennecke, K.; Hartz, T.; Schmitz, M.; Hoffschmidt, B.; The solar tower Jülich—A research and demonstration plant for central Receiver Systems, in SolarPACES 2009 Conference Proceedings, ISBN 978-3-00-028755-8

[5] Abengoa Solar S. A., White Paper on Solar Tower Technologies, Solutions to Global Climate Change, downloaded on 19 Aug. 2010 from www.abengoasolar.com of Abengoa Solar S. A. with headquarters at Avda de la Buhaira 2, 48018 Seville, Spain

[6] www.esolar.com of eSolar Inc. with headquarters at 130 West Union Street, Pasadena, Calif. 91103, USA

[7] Steve Schell, Design and evaluation of eSolar's Heliostat field, in SolarPACES 2009 Conference Proceedings, 1-18 Sep. 2009, Berlin, Germany, ISBN 978-3-00-028755-8

[8] Schramek, P. and Mills, D. R.; Heliostat for maximum ground coverage; Energy 29; 2004; 701-713

[9] Buck, R.; Bräuning, T.; Denk, T.; Pfänder, M.; Schwarzbözl, P.; Tellez, F; Solar-Hybrid Gas Turbine-based Power Tower Systems (REFOS); Journal of Solar Energy Engineering, Vol. 124, February 2002; pp. 2-9

[10] Liebherr, Data Sheet for Revolving Tower Crane 132 EC-H8 FR.tronic, 132 EC-H8 Litronic. Liebherr-Werk Biberach GmbH, Biberach an der Riss, www.liebherr.com

LIST OF REFERENCE NUMBERS

In the drawings in the figures, the same reference numbers are used for the same situation, and when the last two digits of the reference numbers are identical similar situations are being depicted, which afterwards only the last two digits are listed. The digits coming before the last two digits indicate the number of the particular figure.

10 receiver
11 aperture
12 cavity
13 glass dome
15 absorber
17 inlet for heat transfer agent
18 outlet for heat transfer agent
20 support structure
21 vertical support structure/tower
22 jib or cantilever arm
23 footpoint
24 bracing cable
30 heliostat field
31 north field
32 south field
34 heliostat field recess
36 near field
37 outer boundary of the near field
38 far field
39 outer boundary of the entire heliostat field
80 module of a FQA heliostat
83 group of heliostats
85 frame
87 legs
90 heliostat
91 support frame
92 first rotary axle rigidly connected to mounting surface
93 second rotary axle rigidly connected to reflector
94 mechanical coupling of the tracking of the second rotary axle
95 reflector
99 spatial volume in which the reflector can move freely

The invention claimed is:

1. A method for the design of a heliostat field of a central receiver solar system, comprising the following steps:
a) wherein, in the first step, a setup of heliostats is defined for a near field on a preferably level overall ground surface, having a reflector surface density p of p>60%,
wherein the reflector surface density p is defined as the ratio of the overall reflector surface of a region of the heliostat field to the built-over ground surface of the same region of the heliostat field,
wherein each heliostat has a reflector that can be moved about two rotary axles, which reflects the solar radiation onto the target surface of one or more receivers during the changing position of the sun,
wherein the target surface is configured as an aperture or a thermal absorber or a photovoltaic absorber of the respective receiver, and the normal vector of the target surface of the receiver is directed downward, preferably perpendicular, onto the heliostat field
wherein each heliostat has a first rotary axle and a second rotary axle perpendicular to the first rotary axle and is arranged on a mounting surface,
wherein the first rotary axle is rigidly arranged relative to the mounting surface and the second rotary axle relative to the reflector,
wherein for each heliostat the first rotary axle is configured parallel to the mounting surface and a group of heliostats with a common mounting surface are set up in a row, so that the first rotary axle of the heliostats in the particular group lie on the same line, i.e., are aligned with each other,
wherein the reflector of each heliostat is rectangular and preferably longer in the direction of the second rotary axle than in the direction perpendicular to it and
b) wherein the common mounting surface of one or more groups of heliostats can be inclined to the overall ground surface by an angle α dependent on the position to the receiver,
wherein in the second step the positions of the heliostats are determined with the distance from the receiver, calculating how far the near field with the same reflector surface density p reaches around the receiver and where the far field then begins at the near field,
wherein in the far field the distances in the east-west direction and north-south direction must be increased to prevent or reduce the mutual blocking of the heliostats as much as possible,
wherein blocking means that a heliostat at least partly covers the beam path from the reflector of an adjacent heliostat to the target surface of the receiver,
c) wherein in the third step the radiation power which the respective heliostats transfer onto the target surface of the receiver is calculated and preferably those heliostats are chosen for the heliostat field that contribute at the designed time or other determined times the highest component to the radiation power on the target surface of the receiver,
wherein the heliostat field is formed at least by a near field and, depending on the required radiation power on the target surface of the receiver, also a far field,
wherein, if a receiver height $H_R$ of at least 100 m is chosen, a far field is provided and the largest diameter $D_H$ of the heliostat field is preferably less than six times the receiver height $H_R$,
wherein in the fourth step a support structure is chosen, which is suitable to holding the receiver in the defined position above the heliostat field, this support structure being configured as
i. an arch,
ii. or a truss
iii. or a suspended cable construction,
wherein these three support structures i, ii and iii, each with at least two footpoints that are preferably located in the outer region or outside the heliostat field,
iv. or a cranelike support system with a jib or cantilever arm supporting the receiver, which extends across the heliostat field,
wherein one or more footpoints of the cranelike support system is located either in the outer region or preferably outside of the heliostat field on the side of the receiver facing away from the equator,
wherein the position of a receiver mounted on the jib can be changed in up to three dimensions,
so that for the heliostat field determined in the third step different positions can be chosen for the receiver for particular positions of the sun in order to increase the efficiency of the heliostat field for the respective positions of the sun.

2. A central receiver solar system with a heliostat field, comprising:
a) one or more receivers,
b) a plurality of heliostats, forming the heliostat field, which are arranged on a preferably level overall ground surface, wherein each heliostat has a reflector that can be moved about two rotary axles, which reflects the solar radiation onto the target surface of the one or more receivers during changing position of the sun, wherein the target surface is configured as an aperture or a thermal absorber or a photovoltaic absorber (2015) of the respective receiver,
wherein each heliostat has a first rotary axle and a second rotary axle perpendicular to the first rotary axle and is arranged on a mounting surface,
wherein the first rotary axle is rigidly arranged relative to the mounting surface and the second rotary axle relative to the reflector, and
c) a support structure, on which the one or more receivers are secured above the heliostat field,
characterized in that,
d) the heliostat field is formed with parallel rows of heliostats,
e) the support structure for the receiver is configured as a support structure reaching across the heliostat field,
f) the first rotary axle for each heliostat is oriented parallel to the mounting surface,
g) heliostats with a common mounting surface are arranged in a row, so that the first rotary axle of the heliostats in the respective group lie on the same line, i.e., are aligned with each other,
h) each reflector is rectangular in configuration, and the reflector is preferably longer in the direction of the second rotary axle (993; 1293, 1393) than in the direction perpendicular to this,
i) the normal vector of the target surface of the receiver is pointed downward, preferably perpendicular, at the heliostat field and
j) the heliostat field has a near field underneath the receiver, which as a reflector surface density $\rho$ of $\rho>60\%$, where the reflector surface density $\rho$ is defined as the ratio of the overall reflector surface of a region of the heliostat field to the built-over ground surface of the same region of the heliostat field.

3. The central receiver solar system according to claim 2, wherein in the near field the spacings of neighboring heliostats within each row have a predetermined first spacing and the spacings of neighboring rows have a predetermined second spacing from each other in the direction perpendicular to this.

4. The central receiver solar system according to claim 2, wherein the rows of the heliostat field are oriented in the east-west direction or the rows of the heliostat field are oriented in the north-south direction.

5. The central receiver solar system according to claim 2, wherein the common mounting surface of one or more groups of heliostats is inclined to the overall ground surface each time by an angle $\alpha$, dependent on the position to the receiver, while a number of groups of heliostats with common mounting surface and with parallel first rotary axles in a row perpendicular to the first rotary axle are assembled into a module and several modules are assembled into a module row.

6. The central receiver solar system according to claim 5, wherein in the near field, the heliostat field underneath the receiver, the spacings of neighboring groups of heliostats within each module each time have a predetermined first spacing and the spacing of neighboring module rows in the direction perpendicular to this have a predetermined second spacing from each other.

7. The central receiver solar system according to claim 2, wherein the first rotary axle of the group of heliostats is mechanically coupled so that the heliostats (1290, 1390) have a common rotary axle.

8. The central receiver solar system according to claim 2, wherein the support structure for the receiver extends as an arch across the heliostat field, wherein two or more footpoints of the arch are preferably located in the outer region or outside the heliostat field.

9. The central receiver solar system according to claim 2, wherein the support structure for the receiver extends as a truss, i.e., a triangular frame, across the heliostat field, wherein two or more footpoints of the truss are preferably located in the outer region or outside of the heliostat field.

10. The central receiver solar system according to claim 2, wherein the support structure for the receiver extends as a suspended cable construction across the heliostat field, wherein two or more footpoints of the suspended cable construction are located preferably in the outer region or outside of the heliostat field.

11. The central receiver solar system according to claim 2, wherein the support structure for the receiver extends across the heliostat field as a cranelike support system with a jib or cantilever arm supporting the receiver, wherein one or more footpoints of the cranelike support system are located either in the outer region or preferably outside of the heliostat field on the side of the receiver facing away from the equator.

12. The central receiver solar system according to claim 11, wherein the jib of the cranelike support structure can turn about the vertical axis, so that the positions of the receiver can be changed, the receiver is preferably arranged able to move along the jib of the cranelike support structure, so that the position of the receiver can be additionally changed, and preferably the height of the receiver is arranged to be changeable.

13. The central receiver solar system according to claim 2, wherein the support structure carries the receiver in a suspended arrangement on its bottom side facing the heliostat field.

14. The central receiver solar system according to claim 2, wherein the heliostat field extends in the north, east, south and west direction underneath and around the receiver, forming a continuous heliostat field throughout.

15. The central receiver solar system according to claim 2, wherein the heliostat field in addition to the near field has a far field, in which the spacings between the heliostats increase in the east-west direction or north-south direction with increasing distance from the receiver.

16. The central receiver solar system according to claim 2, wherein the heliostat field in addition to the near field has a far field, in which with increasing distance from the receiver the spacings between the module rows increase in the north-south direction or in the east-west direction the spacings between groups of heliostats within a module increase from one module to the next.

17. The central receiver solar system according to claim 2, wherein receiver height $H_R$ is at least 100 and the largest diameter $D_H$ of the heliostat field is preferably less than six times the receiver height $H_R$.

* * * * *